US008989692B2

(12) United States Patent
Kwon et al.

(10) Patent No.: US 8,989,692 B2
(45) Date of Patent: *Mar. 24, 2015

(54) HIGH SPEED, WIDE FREQUENCY-RANGE, DIGITAL PHASE MIXER AND METHODS OF OPERATION

(71) Applicant: Micron Technology, Inc., Boise, ID (US)

(72) Inventors: Chang-ki Kwon, San Diego, CA (US); Eric Booth, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/889,099

(22) Filed: May 7, 2013

(65) Prior Publication Data

US 2013/0241608 A1 Sep. 19, 2013

Related U.S. Application Data

(63) Continuation of application No. 13/041,118, filed on Mar. 4, 2011, now Pat. No. 8,437,726, which is a continuation of application No. 11/983,201, filed on Nov. 7, 2007, now Pat. No. 7,907,928.

(51) Int. Cl.
*H04B 1/26* (2006.01)
*H03L 7/00* (2006.01)
(Continued)

(52) U.S. Cl.
CPC ................. *H03L 7/00* (2013.01); *H03L 7/0814* (2013.01); *G06G 7/12* (2013.01); *H03K 17/00* (2013.01)
USPC .......................................................... 455/330

(58) Field of Classification Search
CPC ............ G06G 7/12; H03K 17/00; H03L 7/00; H03L 7/0814; H03L 7/0891; H03L 7/091
USPC ......... 455/205, 209, 323, 326, 330, 333, 334, 455/341; 327/115, 116, 119, 355, 356, 359, 327/372
See application file for complete search history.

(56) References Cited

U.S. PATENT DOCUMENTS 5,463,337 A 10/1995 Leonowich
6,313,688 B1 11/2001 Lee et al.
(Continued)

OTHER PUBLICATIONS

Sidiropoulos, et al., "A Semidigital Dual Delay-Locked Loop", IEEE Journal of Solid-State Circuits, vol. 32, No. 11, Nov. 1997, 1683-1692.

*Primary Examiner* — Thanh Le
(74) *Attorney, Agent, or Firm* — Dorsey & Whitney LLP

(57) ABSTRACT

The present disclosure is directed to a unit phase mixer in combination with an input buffer. The unit phase mixer has a pull-up path for pulling an output terminal up to a first voltage. The pull-up path has a first transistor responsive to a first enable signal and a series connected second transistor responsive to a first clock signal. The unit phase mixer has a pull-down path for pulling the output terminal down to a second voltage. The pull-down path has a third transistor responsive to a second clock signal and a series connected fourth transistor responsive to a second enable signal. The input buffer skews the first and second clock signals by different amounts to enable a break-before-make method of operation so that the first voltage is not connected to the second voltage. The unit phase mixer can be used as a building block in more complex mixers which may include the ability to weight the input clocks as well as providing feed-forward paths for certain of the signals. Because of the rules governing abstract, this abstract should not be used to construe the claims.

21 Claims, 21 Drawing Sheets

(51) Int. Cl.
  *H03L 7/081* (2006.01)
  *G06G 7/12* (2006.01)
  *H03K 17/00* (2006.01)

(56) References Cited

U.S. PATENT DOCUMENTS

| | | |
|---|---|---|
| 6,393,083 B1 | 5/2002 | Beukema |
| 6,661,863 B1 | 12/2003 | Toosky |
| 6,937,077 B2 | 8/2005 | Zarate et al. |
| 6,952,127 B2 | 10/2005 | Lee |
| 7,161,394 B2 | 1/2007 | Lee |
| 7,907,928 B2 | 3/2011 | Kwon et al. |
| 8,099,070 B2 * | 1/2012 | Mu et al. ............ 455/209 |
| 8,437,726 B2 | 5/2013 | Kwon |
| 2002/0030529 A1 * | 3/2002 | Lee et al. ............ 327/359 |
| 2003/0001635 A1 | 1/2003 | Lee et al. |
| 2003/0219088 A1 | 11/2003 | Kwak |
| 2003/0236083 A1 | 12/2003 | Wiklund et al. |
| 2005/0110539 A1 | 5/2005 | Lee |
| 2005/0110554 A1 | 5/2005 | Lee |
| 2009/0116602 A1 | 5/2009 | Kwon et al. |
| 2009/0143031 A1 * | 6/2009 | Shah ............ 455/150.1 |
| 2010/0061167 A1 | 3/2010 | Kim et al. |
| 2011/0156788 A1 | 6/2011 | Kwon |

* cited by examiner

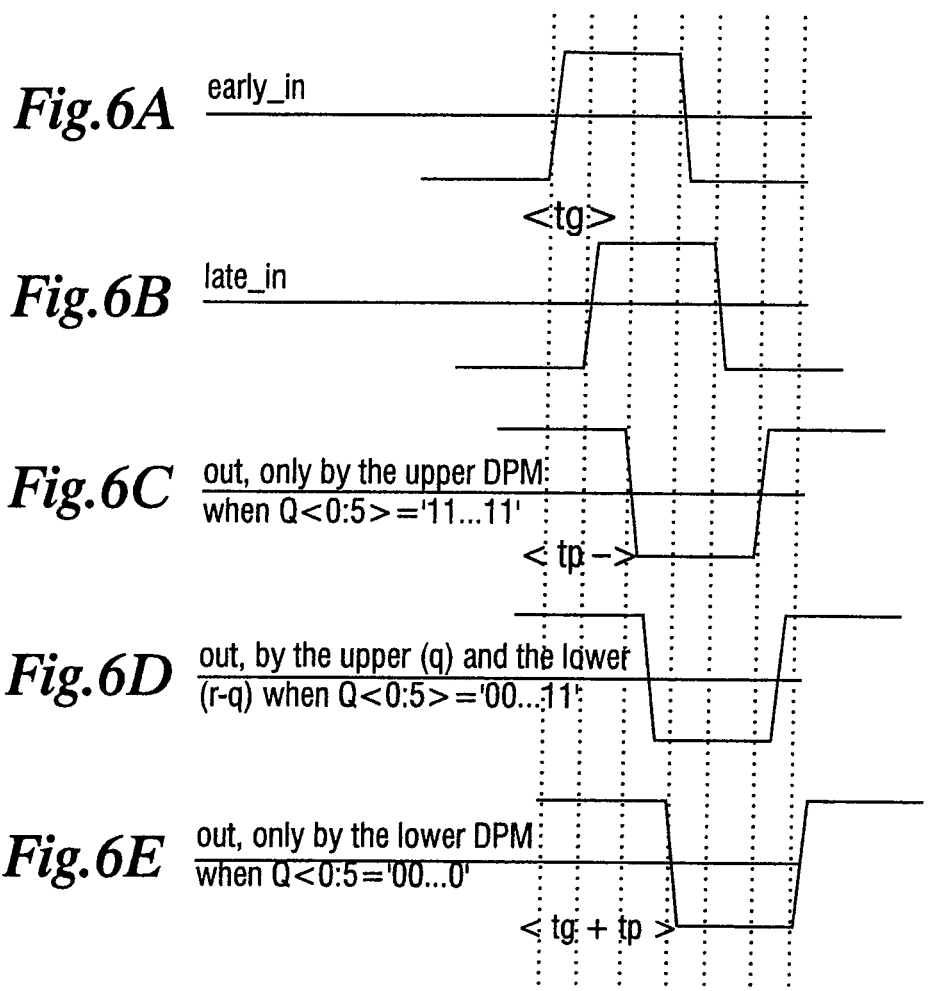

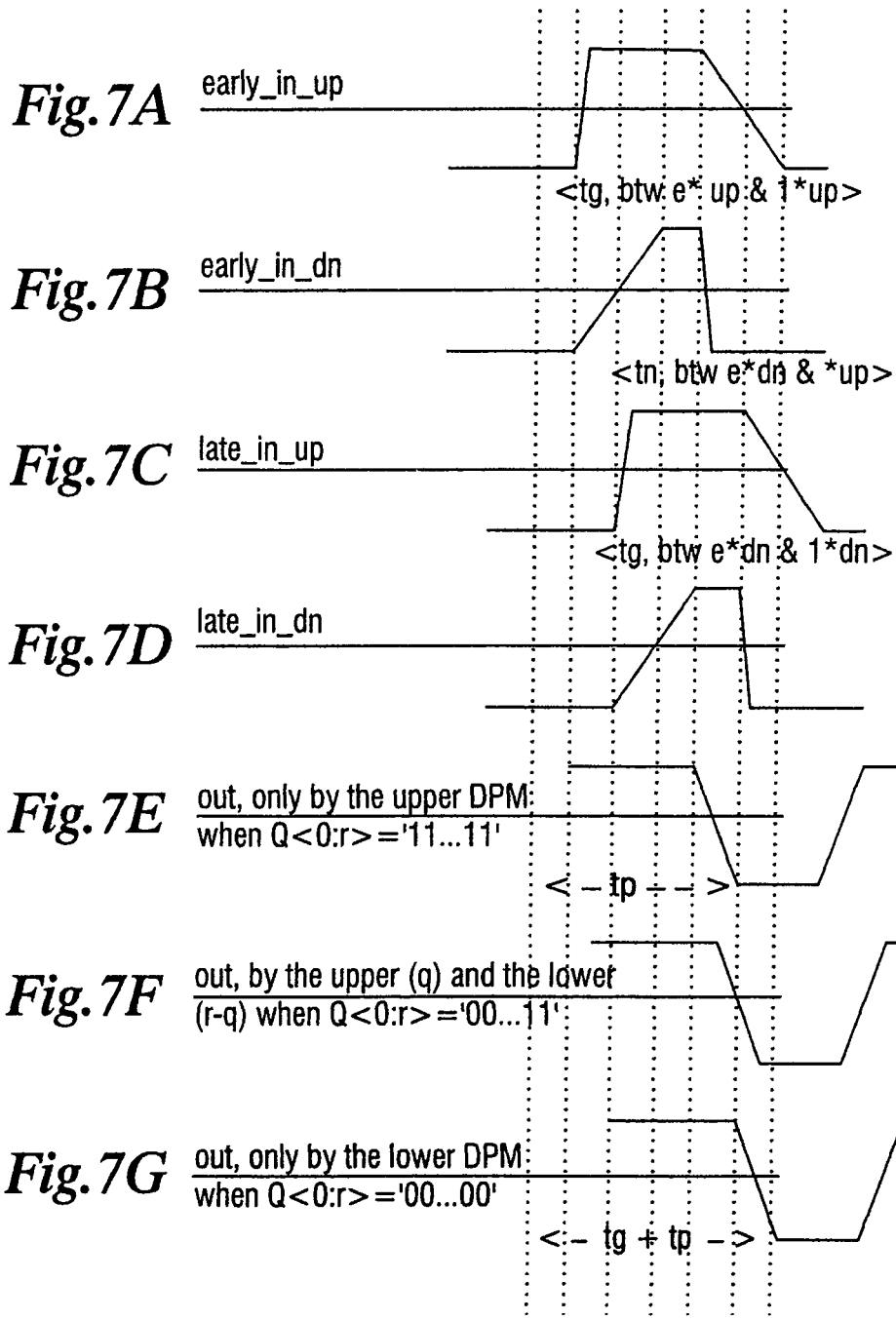

HIGH SPEED, WIDE FREQUENCY-RANGE, DIGITAL PHASE MIXER AND METHODS OF OPERATION

CROSS-REFERENCE TO RELATED APPLICATIONS

This application is a continuation of U.S. patent application Ser. No. 13/041,118, filed Mar. 4, 2011, U.S. Pat. No. 8,437,726, issued on May 7, 2013, which is a continuation of U.S. patent application Ser. No. 11/983,201, filed Nov. 7, 2007, U.S. Pat. No. 7,907,928, issued on Mar. 15, 2011. These applications and patent are incorporated by reference herein in their entirety and for all purposes.

BACKGROUND OF THE INVENTION

The present invention is directed generally to phase locked loops (PLL) and delay locked loops (DLL) and, more particularly, to locked loops having a digital phase mixer.

PLLs and DLLs are often used as synchronization circuits for generating clock signals for compensating for a skew between an external clock signal and data or between the external clock signal and an internal clock signal.

FIG. 1 is an example of a block diagram illustrating a prior art clock synchronization circuit 10, which is a linear, register controlled DLL suitable for use in a semiconductor memory device. The DLL 10 includes: a receiving circuit 11 which produces a buffered clock signal Iclk. A variable delay line 12 and a phase detector 13 are responsive to the receiving circuit 11. The phase detector 13 produces shift left (SHL) and shift right (SHR) control signals which are input to a shift register 14. The shift register 14 produces control signals CSL1-CSLn which are used to control the variable delay line 12. The signals SHL and SHR are also input to a control unit 15 which produces a signal CON input to the shift register 14 and signals SN and SA which are input to a phase mixer 16. The phase mixer 16 also receives signals NDS and ADS from the variable delay line 12. The NDS signal is produced by delaying the buffered clock signal Iclk for a predetermined time, and the ADS clock signal is produced by additionally delaying the normal delay clock signal NDS for a further predetermined time.

The phase mixer 16 mixes the phases of the normal delay clock signal NDS and the additionally delayed clock signal ADS from the variable delay line 12, and outputs an internal clock signal INclk having a phase that is between the phases of the two input clock signals. The internal clock signal INclk is feedback through a delay monitor 17 to the phase detector 13. The control unit 15 outputs the control signals SN1-SNn and SA1-SAn to control the operation of the phase mixer 16 so that the internal clock signal INclk has a phase that is between the phases of the normal delay clock signal NDS and the additionally delayed clock signal ADS.

FIG. 2 is an example of a detailed circuit diagram illustrating a prior art delay line 19 constructed of four conventional delay elements 20-23. Each of the delay elements 20-23 is comprised of two series connected NAND gates. A clock signal ClkO is available at the output of the delay element 20. A clock signal Clk1 is available at the output of delay element 21. A clock signal Clk2 is available at the output of delay element 22 and a clock signal CLKout is available at the output of the delay element 23. The delay line 19 of FIG. 2 may be used in conjunction with the conventional six-weight phase mixers 25 and 26 as shown in FIG. 3 for even and odd delay lines, respectively.

Turning now to FIG. 3, FIG. 3 illustrates two conventional six weight phase mixers 25, 26 along with input buffers 27. The input buffers 27 provide two clock signals which are input to the conventional six-weight phase mixers 25, 26. The phase mixers receive (r−1) bit Q<0:r> that determines the weight to be assigned to each of the input clock signals. The output delay/slew rate of the phase mixers is generally controlled by Q<0:r> through the use of thermometer codes and the capacitive load of the components connected to and used in constructing the phase mixers.

FIG. 4 illustrates one inverter 32 and two unit digital phase mixers 30, 31, which comprise a two weight (two-bit) phase mixer 29. The two weight phase mixer 29 is sometimes referred to as a cell. The cell shown in FIG. 4 is often fabricated in pairs to allow options for the number of delays and to allow the layout to share common inputs. The conventional six-weight phase mixers 25 and 26 can be constructed from cells which are the same as that shown in FIG. 4.

Each of the unit phase mixers 30, 31 may have a construction as shown in FIG. 5. FIG. 5 is an example of a prior art, unit (one-bit) phase mixer labeled 30 or 31. Any number of unit phase mixers 30/31 may be connected in parallel as shown, for example, in FIG. 6 which illustrates a six weight phase mixer 34.

Note that in FIG. 6, one input (early_in) to the early unit phase mixers 62 will lag the other input (late_in) to the late unit phase mixers 63. As a result, there is a short timing gap (tg) between the two inputs. FIGS. 6A and 6B show the input (early_in) to the early unit phase mixers and the input (late_in) to the late unit phase mixers, and the timing gap (tg) between the two inputs. FIGS. 6C-6E illustrate output signals produced by the six weight phase mixer under various weighting conditions. The timing gap (tg) between the early input to the early unit phase mixers and the late input to the late unit phase mixers creates a fighting condition that causes short circuit currents to flow between the early unit phase mixers and late unit phase mixers. In this example, the worst case fighting condition occurs during time interval (tg), while Q<0:5> equal is to 000111 or 111000. Moreover, notice that in the prior art, the fighting condition exists at any Q<0:5> except only two cases (000000 and 111111). Thus, it is desirable to have a phase mixer that reduces or eliminates this fighting condition while maintaining or improving reliability, power dissipation, and a wide frequency range of operation.

BRIEF DESCRIPTION OF THE FIGURES

For the present invention to be easily understood and readily practiced, the present invention will now be described, for purposes of illustration and not limitation, in conjunction with the following figures, wherein:

FIGS. 6A 6B illustrate input signals that are helpful in understanding the operation of the circuit shown in FIG. 6;

FIGS. 6C-6E illustrate various weighted output signals produced during the operation of the circuit shown in FIG. 6;

FIGS. 7A-7D illustrate regulation signals that are helpful in understanding the operation of the circuit shown in FIG. 7;

FIGS. 7E-7G illustrate various weighted output signal produced during the operation of the circuit shown in FIG. 7;

FIG. 8, is an example of a six weight phase mixer having distributed break-before-make drivers, feedback loops, and early turn-off;

FIG. 11, is an example of an optimized six weight phase mixer having distributed break-before-make drivers, feedback loops, and early turn-off;

DETAILED DESCRIPTION

Figure 1:
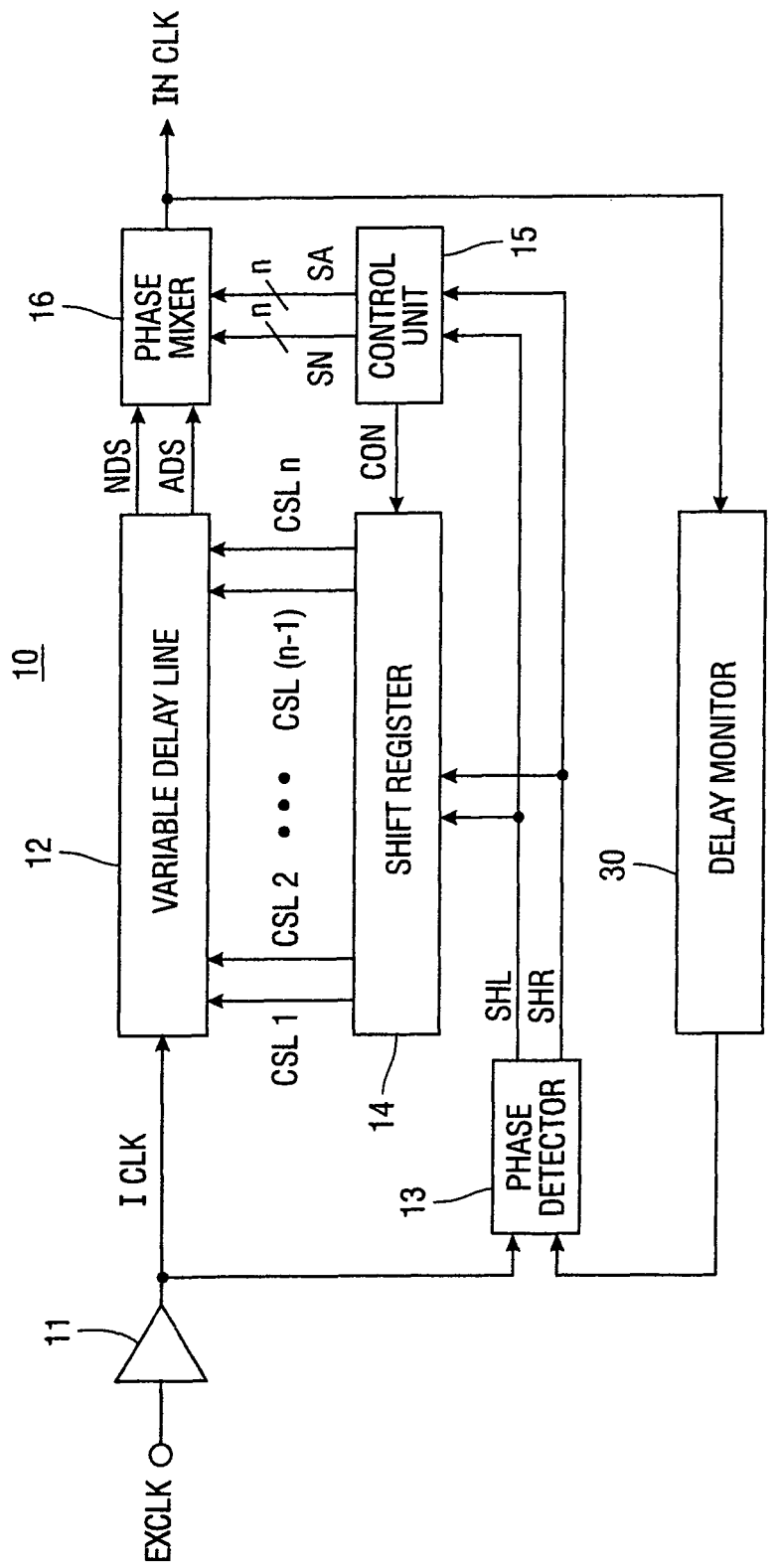
FIG. 1 is a block diagram illustrating a prior art clock synchronization circuit suitable for use in a semiconductor memory device.
Figure 2:
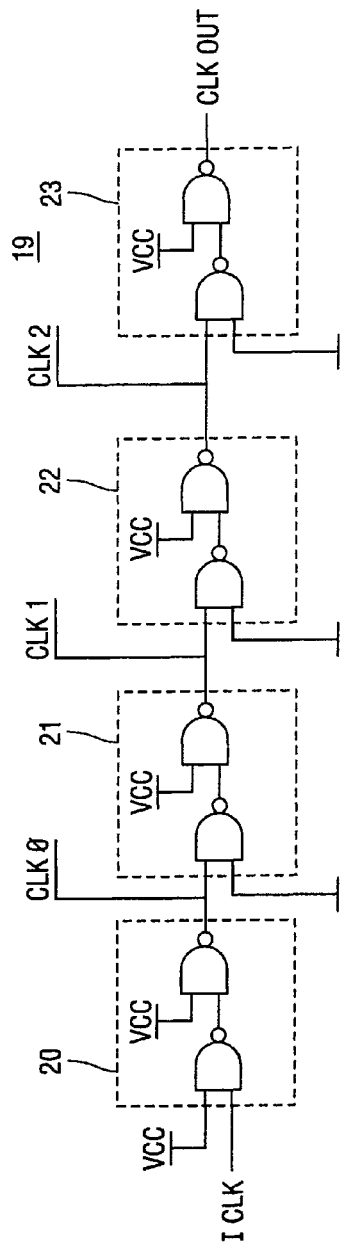
FIG. 2 is a detailed circuit diagram illustrating a prior art delay line constructed of four conventional delay elements.
Figure 3:
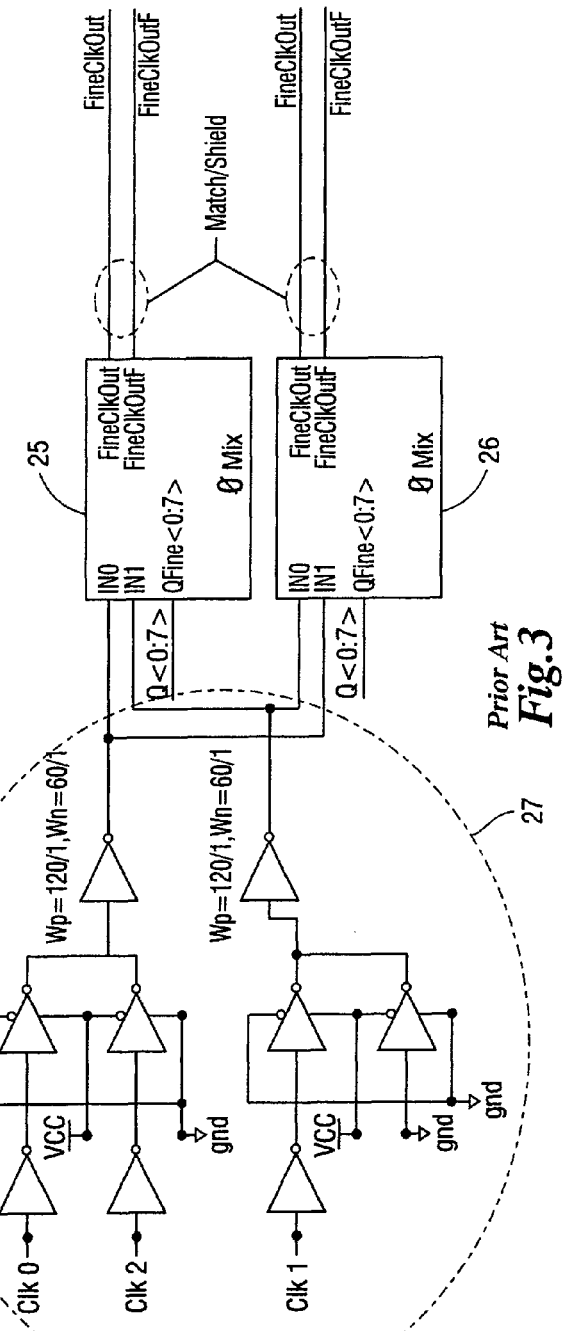
FIG. 3 illustrates two conventional six-weight phase mixers along with an input buffer.
Figure 4:
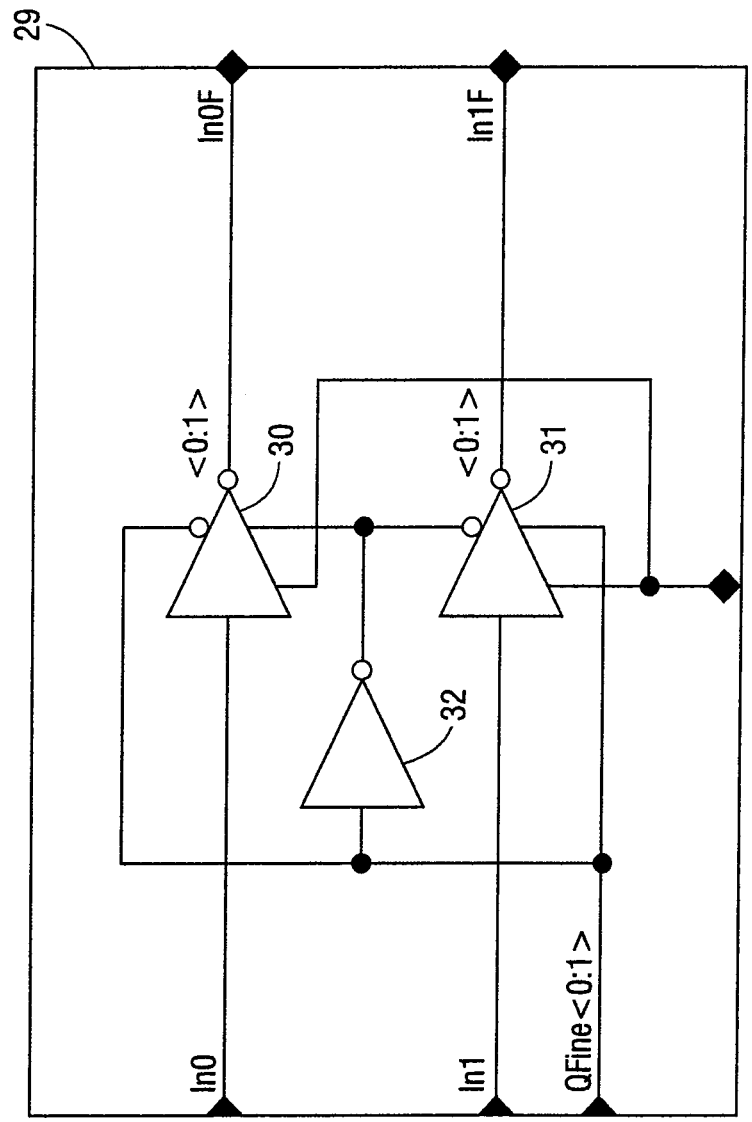
FIG. 4 illustrates a two weight (two-bit) digital phase mixer.
Figure 5:
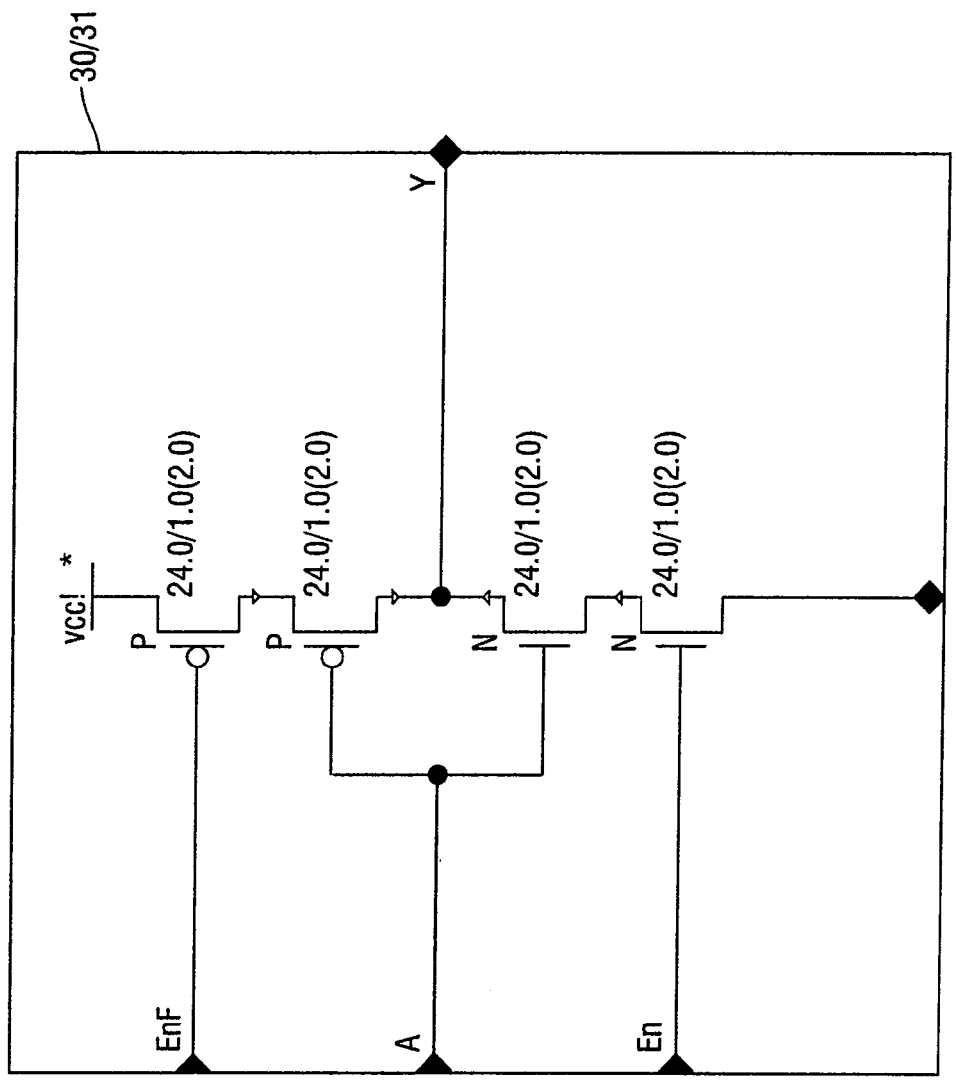
FIG. 5 is an example of a prior art, unit (one-bit) phase mixer.

One aspect of the present disclosure is directed to a one bit (one weight) digital phase mixer comprised of a pull-up path for pulling an output terminal up to a first voltage. The pull-up path is comprised of a first transistor responsive to a first enable signal and a series connected second transistor responsive to a first clock signal. The phase mixer is further comprised of a pull-down path for pulling the output terminal down to a second voltage. The pull-down path is comprised of a third transistor responsive to a second clock signal and a series connected fourth transistor responsive to a second enable signal. The one-bit phase mixer is used in combination with an input buffer which skews the first and second clock signals.

Another aspect of the present disclosure is directed to a method of operating a one-bit, digital phase mixer, comprising inputting a first clock or regulation signal to a pull-up path connecting an output terminal to a first voltage. A first enable signal is also input to the first pull-up path. A second clock or regulation signal is input to a pull-down path connecting the output terminal to a second voltage. A second enable signal is also input to the pull-down path, wherein the first and second regulation signals are timed to prevent both the first and said second voltage sources from being connected to the output terminal at the same time.

Phase mixers of various sizes may be constructed by combining one-bit phase mixers in parallel. In one embodiment, a phase mixer may be constructed of two pull up paths and two pull down paths. Each path is responsive to a separate enable signal (e.g., Inup(Q0), Indn(Q0), Inup(Qr), Indn(Qr)) and two clock or regulation signals (e.g., early in_up and early_in dn). In another embodiment, a phase mixer may be constructed of two pull up paths and two pull down paths, each responsive to the same enable signals (e.g. Inup(Q0), Indn(Qr) and four clock or regulation signals (e.g., early_in_up, early_in dn, late in up, and late_in_down). In yet another embodiment, a phase mixer may be comprised of two, two-bit phase mixers responsive to four different clock signals and four different enable signals. Methods of operating such phase mixers are also disclosed.

In the operation of the phase mixers, one of the clock or regulation signals (e.g. early_in_up) may have a fast slew rate and another of the clock or regulation signals (e.g., early_in_dn) may have a slow slew rate. When four clock signals are to be mixed, the third clock signal and fourth clock signal (e.g., late_in_up and late_in_dn, respectively), may be similar to the first and second clock signals, respectively, but shifted time-wise with respect thereto.

Another aspect of the present disclosure is directed to a phase mixer (or a break-signal generator/transmitter) of the type comprised of a plurality of parallel connected, one-bit, digital phase mixers. The first phase mixer (or background generator/transmitter) controls a first plurality of phase mixers to prevent both the phase mixers responsive to an early signal from "fighting" the phase mixers responsive to the late signal. The second phase mixer (or background generator/transmitter) provides the same function for a second plurality of phase mixers.

Figure 7:
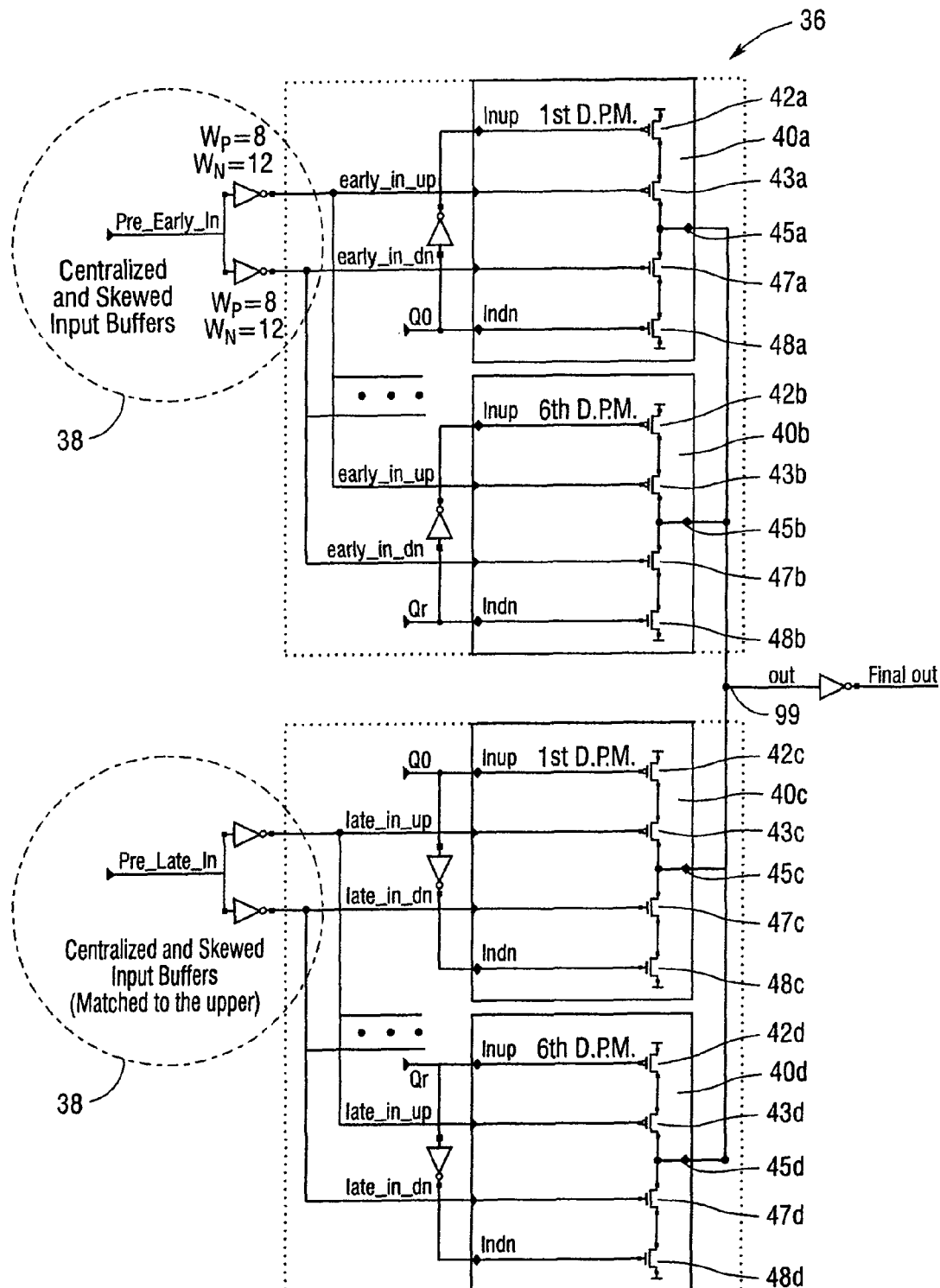
FIG. 7 is an example of a six weight phase mixer and associated input circuits constructed according to the teachings of the present disclosure.
Figure 8A:
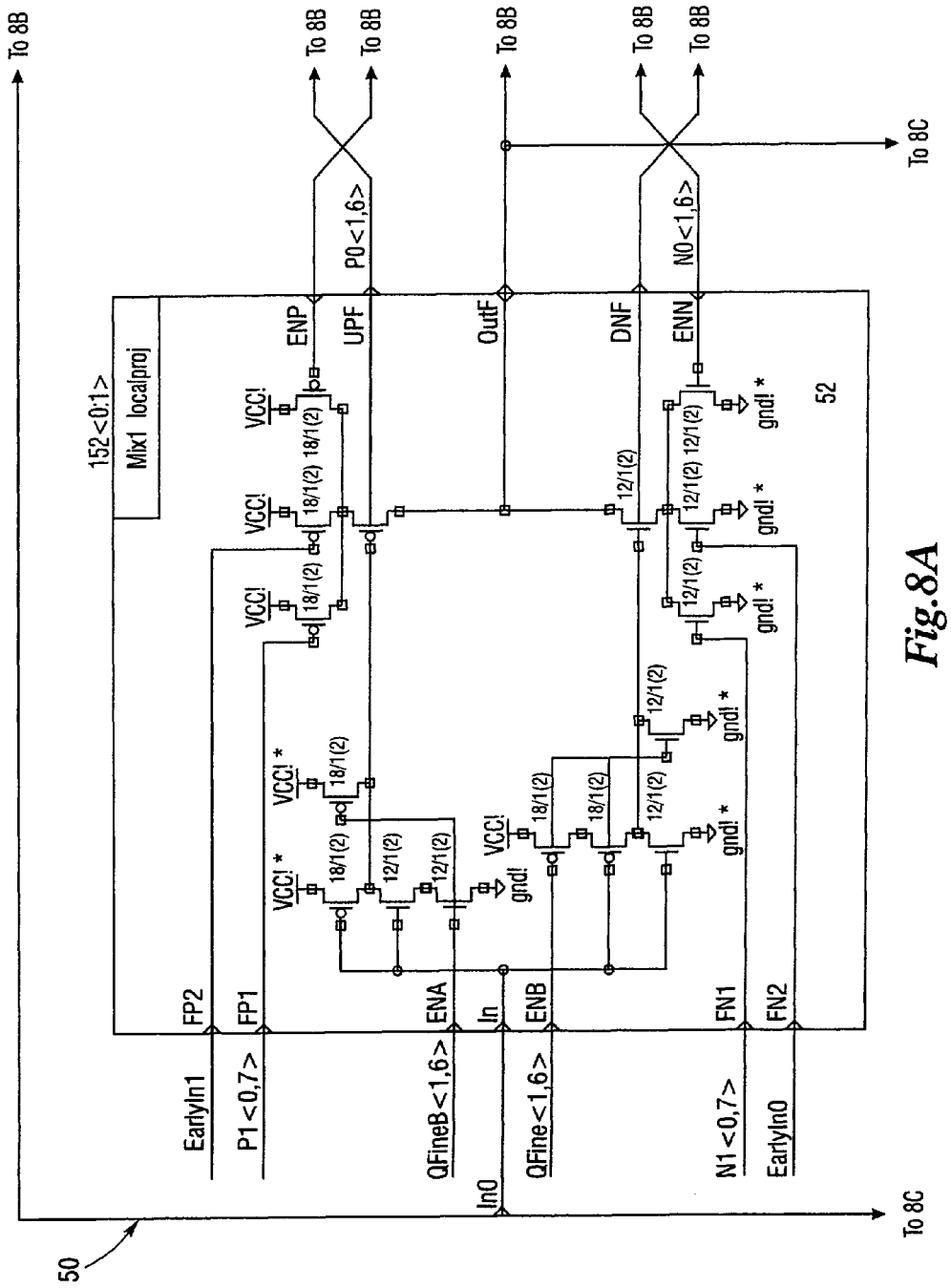
FIGS. 8A-8D, collectively
Figure 8B:
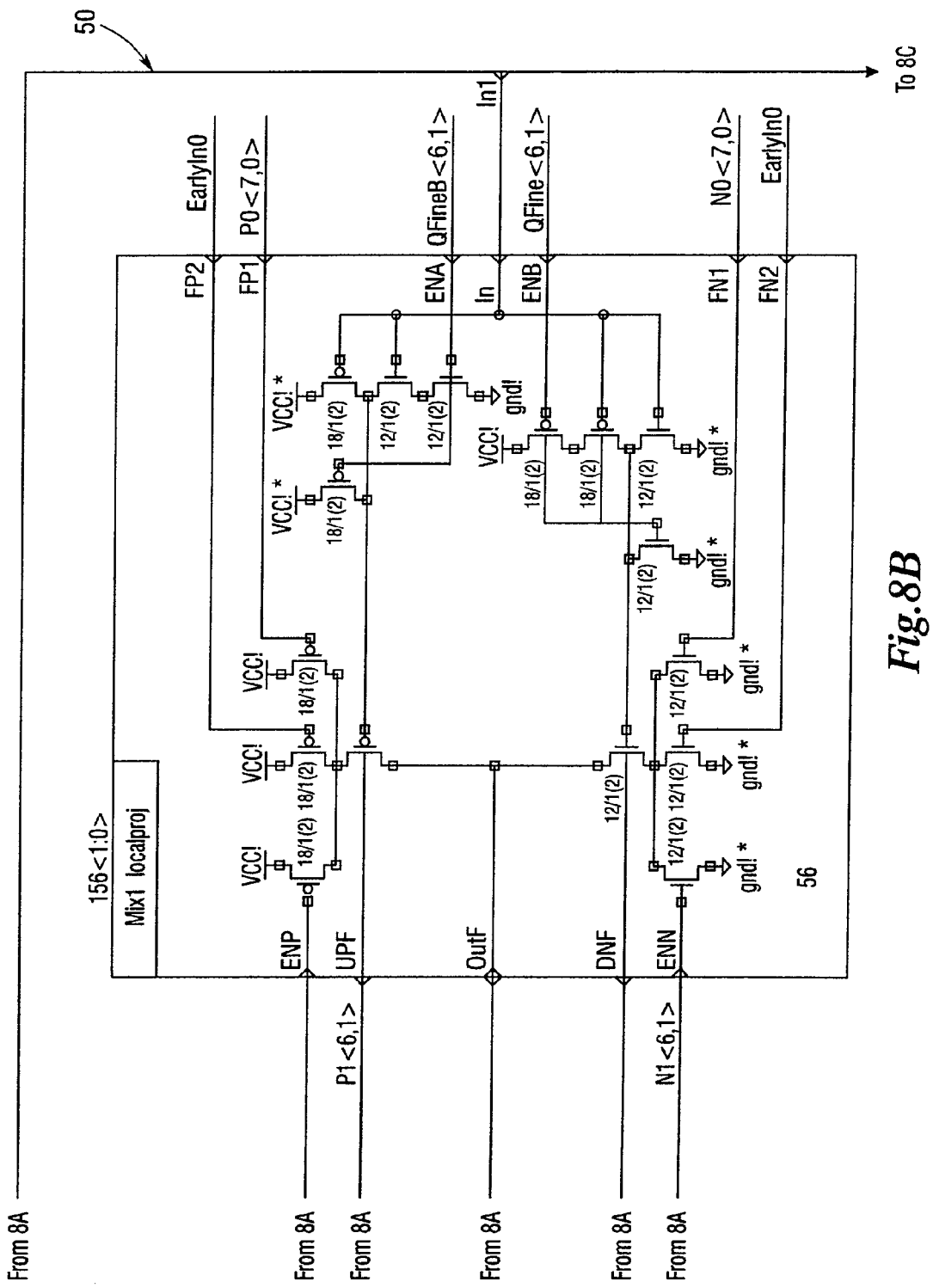
Figure 8C:
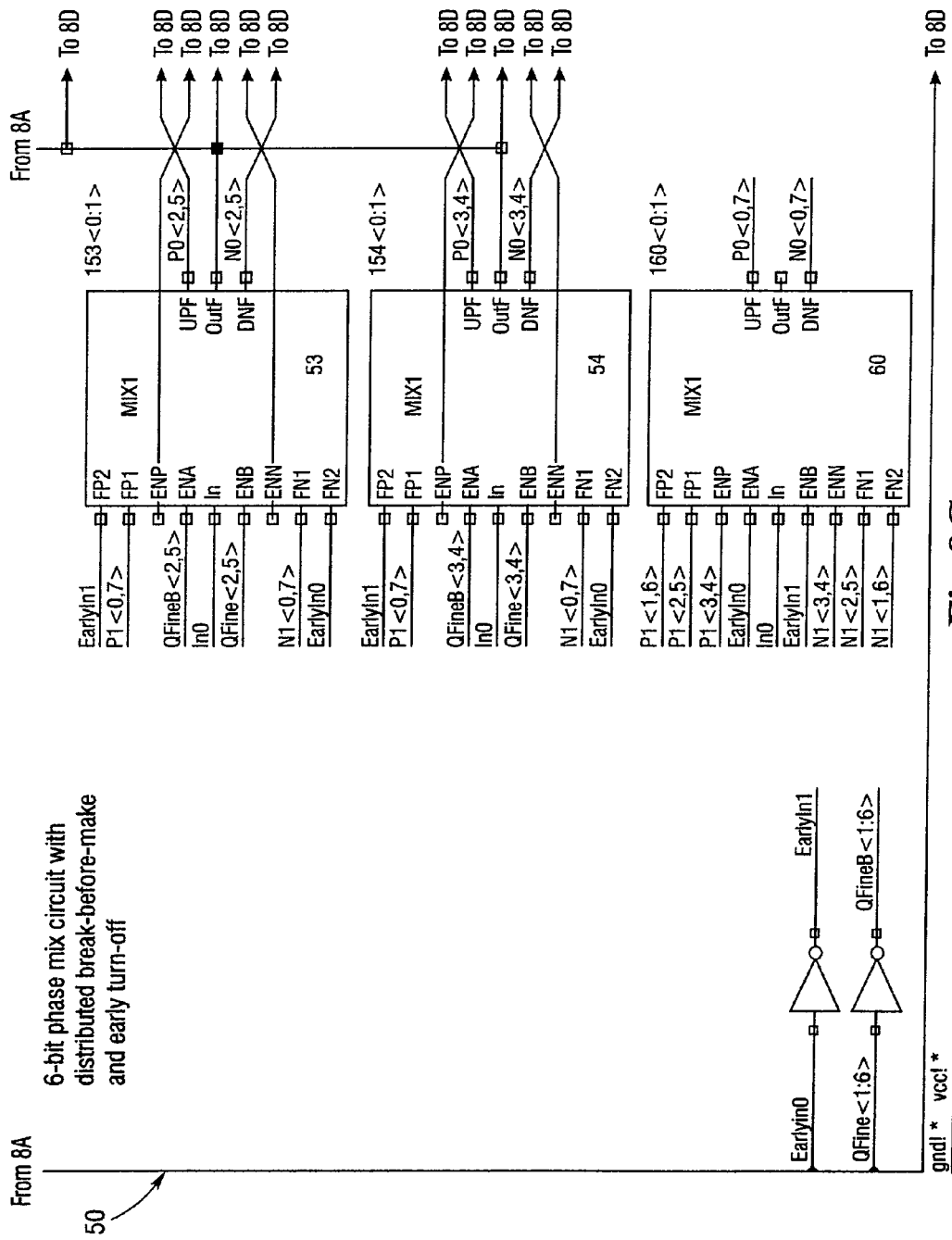
Figure 8D:
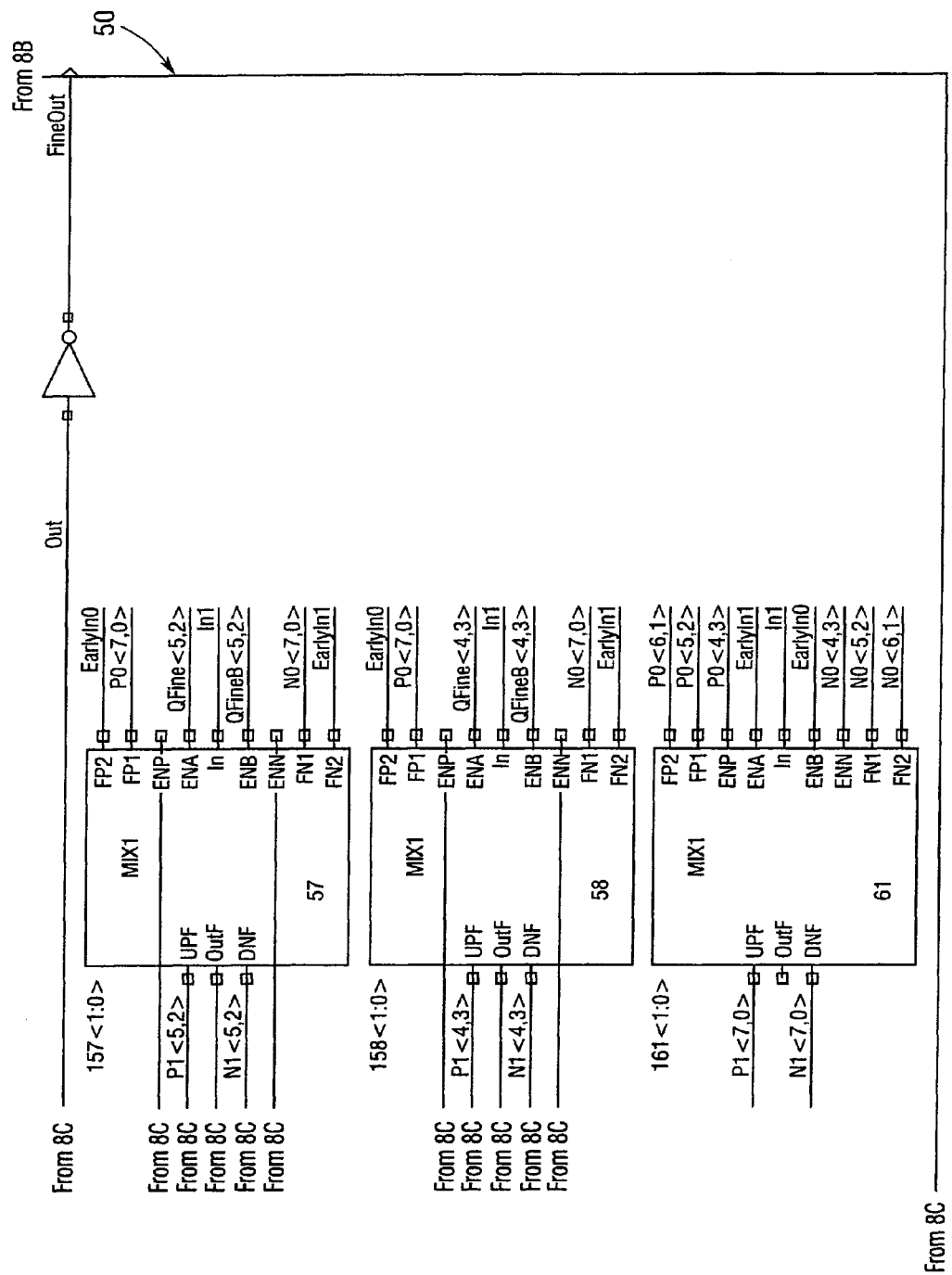

FIG. 7 is an example of a six weight, break-before-make, phase mixer 36 and associated input circuits 38 constructed according to the teachings of the present disclosure. The phase mixer 36 is comprised of a plurality of identical phase mixers, with four identical unit mixers 40a, 40b, 40c and 40d being shown. FIG. 7 illustrates, in addition to the four identical mixers 40a, 40b, 40c, and 40d, the four clock or regulation signals early_in_up, early_in_dn, and late_in_dn used to control the mixers 40a-40d as well as the output signals produced by the mixers of FIG. 7. It should be noted than any number of mixers 40 may be connected in parallel.

The mixer 40a, like each of the other mixers 40b-40d, is comprised of two p-type transistors 42a, 43a series connected between a first voltage, e.g. Vcc, and an output terminal 45a. The transistors 42a, 43a are an example of a pull-up path for pulling the voltage at the output terminal 45a up to the first voltage when the transistor 42a, 43a are both conductive. The transistor 42a receives at its base terminal an enable signal Inup; the transistor 43a receives at its base terminal an input signal early_in_up. The transistor 43a is rendered conductive, according to the diagram of the early_in_up signal shown in FIG. 7A.

The mixer 40a is also comprised of two n-type transistors 47a, 48a series connected between a second voltage, e.g. ground, and the output terminal 45a. The transistors 47a, 48a are an example of a pull-down path for pulling the voltage at the output terminal 45a down to the second voltage when the transistors 47a, 48a are both conductive. The transistor 47a receives at its base terminal an input signal early_in_dn; the transistor 48a receives at its base terminal an enable signal Indn. The transistor 48a is rendered conductive, according to the diagram of the early_in_dn signal shown in FIG. 7B. The signal Inup is the inverse of the signal Indn, which is determined by the enable signal QO.

The mixer 40b is similar in construction and receives the same signals as the mixer 40a, except that the Indn signal is determined by enable signal Qr. The mixer 40c is similar in construction to the mixer of 40a, however the transistor 43c receives the late_in_up signal while the transistor 47c receives the late_in_dn signal shown in FIGS. 7C and 7D, respectively. The mixer 40d is similar in construction and receives the same signals as the mixer 40e, except that the Indn signal is determined by the enable signal Qr.

The circuit of FIG. 7 provides separate turn-on and turn-off paths via the transistors 43a, 47a in mixer 40a, transistors 43b, 47b in mixer 40b, transistors 43c, 47c in mixer 40c and transistors 43d, 47d in mixer 40d. In all cases, the fighting between the mixers that receive the early signals and the mixers that receive the late signals is reduced or eliminated by controlling the slew rates and the duty cycle of the early signals and the late signals in conjunction with the separate turn-on and turn-off paths.

Figure 6:
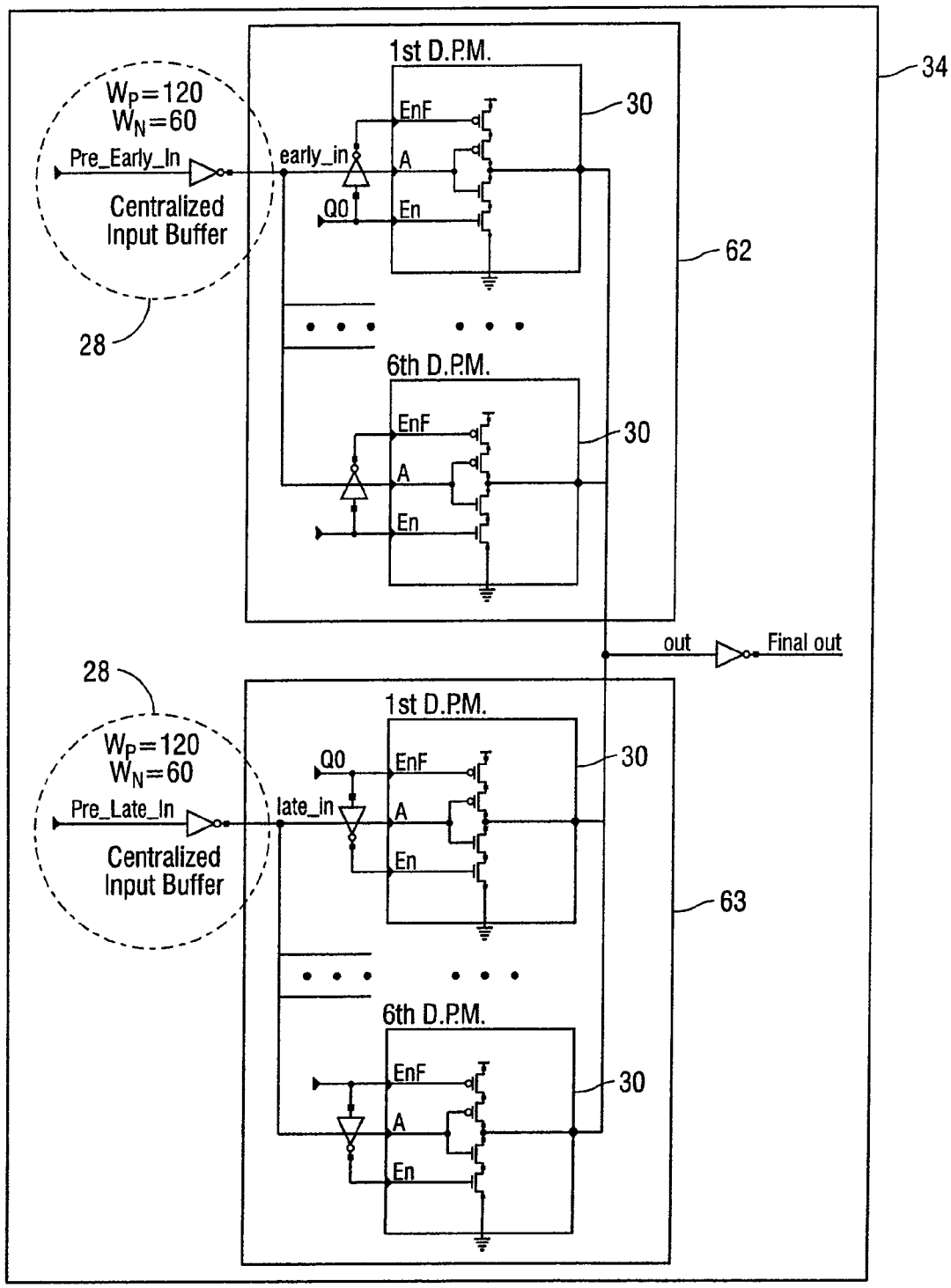
FIG. 6 is an example of a prior art, six weight phase mixer.

The early signal waveforms and the late signal waveforms are shown in FIG. 7A-7D, and various weighted output signals produced at an output terminal 99 are shown in FIG. 7E-7G. Compared to the uniform input signal waveform shown in FIG. 6 (see FIGS. 6A and 6B) generated by the uniform input buffers 28 of FIG. 6, the differing input signal waveforms shown in FIG. 7A-7D are generated by the differing drive-strength or the differing capacitance of the input buffers 38. The differing input waveforms along with the enable signals Q0-Qr, regulate the output signal being produced by each unit phase mixer in the six-weight phase mixer and the output signal being produced by the six-weight phase mixer.

FIG. 8 illustrates a six weight phase mixer 50 having distributed break-before-make drivers, feedback loops, early turn-off, and associated input circuitry constructed according to the teachings of the present disclosure which has improved frequency performance. The phase mixer 50 may be expanded to an eight weight mixer via metal options. The phase mixer 50 is comprised of three active mixers, 52, 53, 54 being the early mixers and another three active mixers 56, 57, 58 being the late mixers. The earlyIn0 and earlyIn1 signals in FIG. 8 may be DC level and the EarlyInO signal may have a logic value of I. Compared to the prior art, the phase mixer 50 has break-before-make self-timing control for each mixer 52-54 and 56-58 because of the separate pull-up and pull-down paths and separate control of each.

The phase mixer 50 has feed-forward/back loops between the early mixers 52, 53, 54 (turned on by Q<i> for mixing clock signal In0) and between the late mixers 56, 57, 58 (turned on by the inverted Q<7-i> for mixing clock signal In 1). The feed-forward loops are implemented by connecting the internal signals for operating the pull-up/pull-down paths in an early mixer with the pull-up/pull-down paths in a late mixer and connecting the internal signals for operating the pull-up/pull-down paths in a late mixer with the pull-up/pull-down paths in an early phase mixer. FIG. 8 show a first feed-forward loop connected between early mixer 52 and late mixer 56, a second feed-forward loop connected between early mixer 53 and late mixer 57, and a third feed-forward loop connected between early mixer 54 and late mixer 58. The feedback loops are implemented using (optioned out) early mixer 60 and (optioned out) late mixer 61. By using only the first feed-forward loops, the worst fighting condition (the three early mixers 52, 53, 54 versus the three late mixers 56, 57, 58) can be mitigated to the two versus two case. Using the first, second, and third feed-forward loops guarantees that the break signals from the early mixers can be fed-forward to the later mixers, so that all the fighting conditions can be eliminated with any thermometer code on (Q<i>. The thermometer codes provide a mechanism to weight the signals.) Note that these concepts/circuits can be expanded to the 8¬ bit/7 level (or the 2-4 bit) mixer more efficiently in terms of area, power, and reliability for high performance than equivalent prior art circuits.

Figure 9:
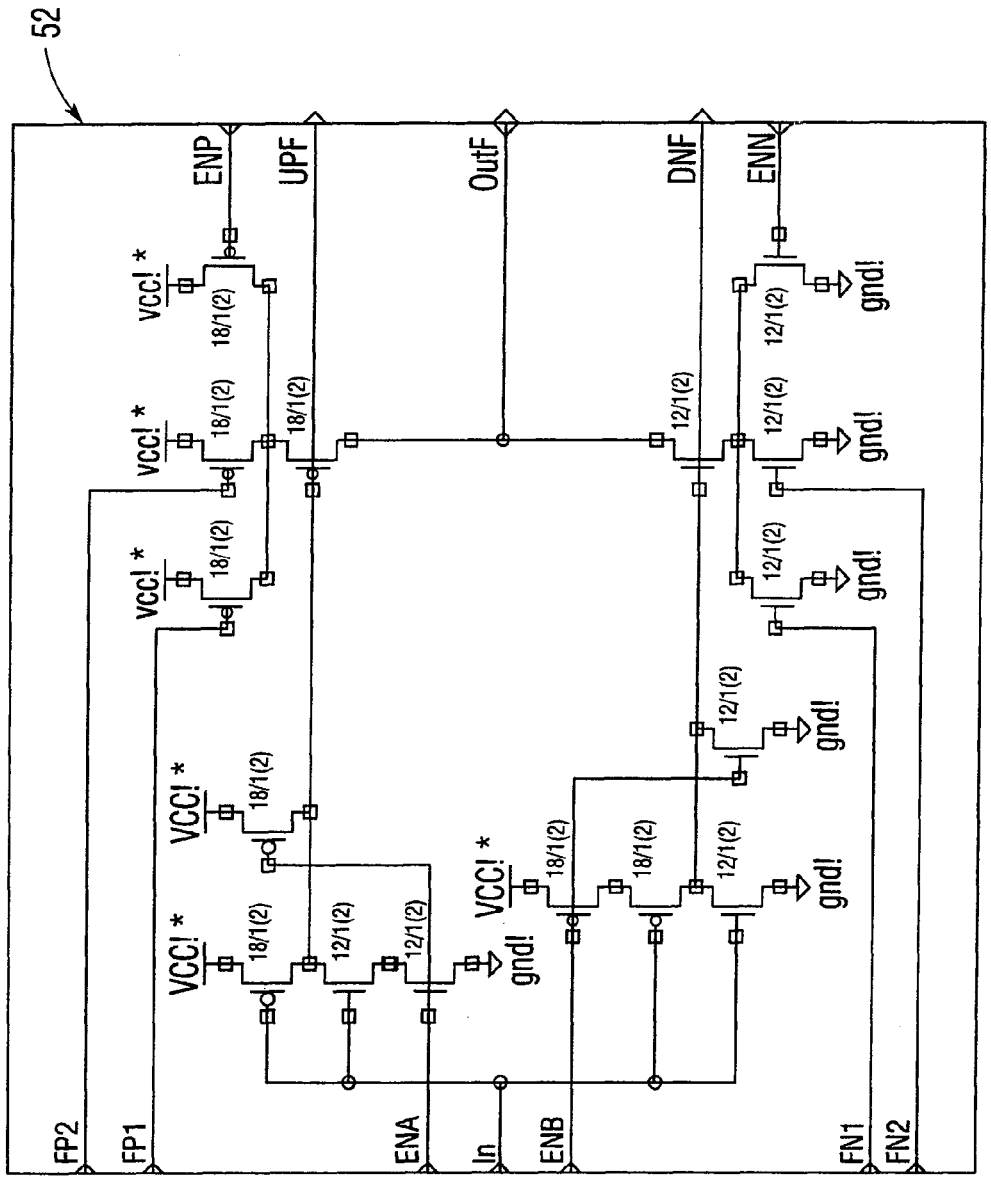
FIG. 9 is a detailed circuit diagram illustrating one example of a unit (one-bit) phase mixer having distributed break-before-make drivers, feedback, and early turn-off, which may be used in the circuit of FIG. 8.

FIG. 9 is a detailed circuit diagram illustrating one example of a one-bit phase mixer 52 having distributed break-before-make drivers, feedback, and early turn-off constructed according to the teachings of the present disclosure and which may be used in the circuit of FIG. 8. All of the mixers shown in FIG. 8 may be similarly constructed, with the input signals modified to so as to enable the phase mixer 50 to operate as described above. The one-bit phase mixer 52 shown in FIG. 9 is not described in detail as that circuit merely illustrates one exemplary embodiment, the operation of which will be understood by one of ordinary skill in the art upon reviewing the figure.

Figure 10A:
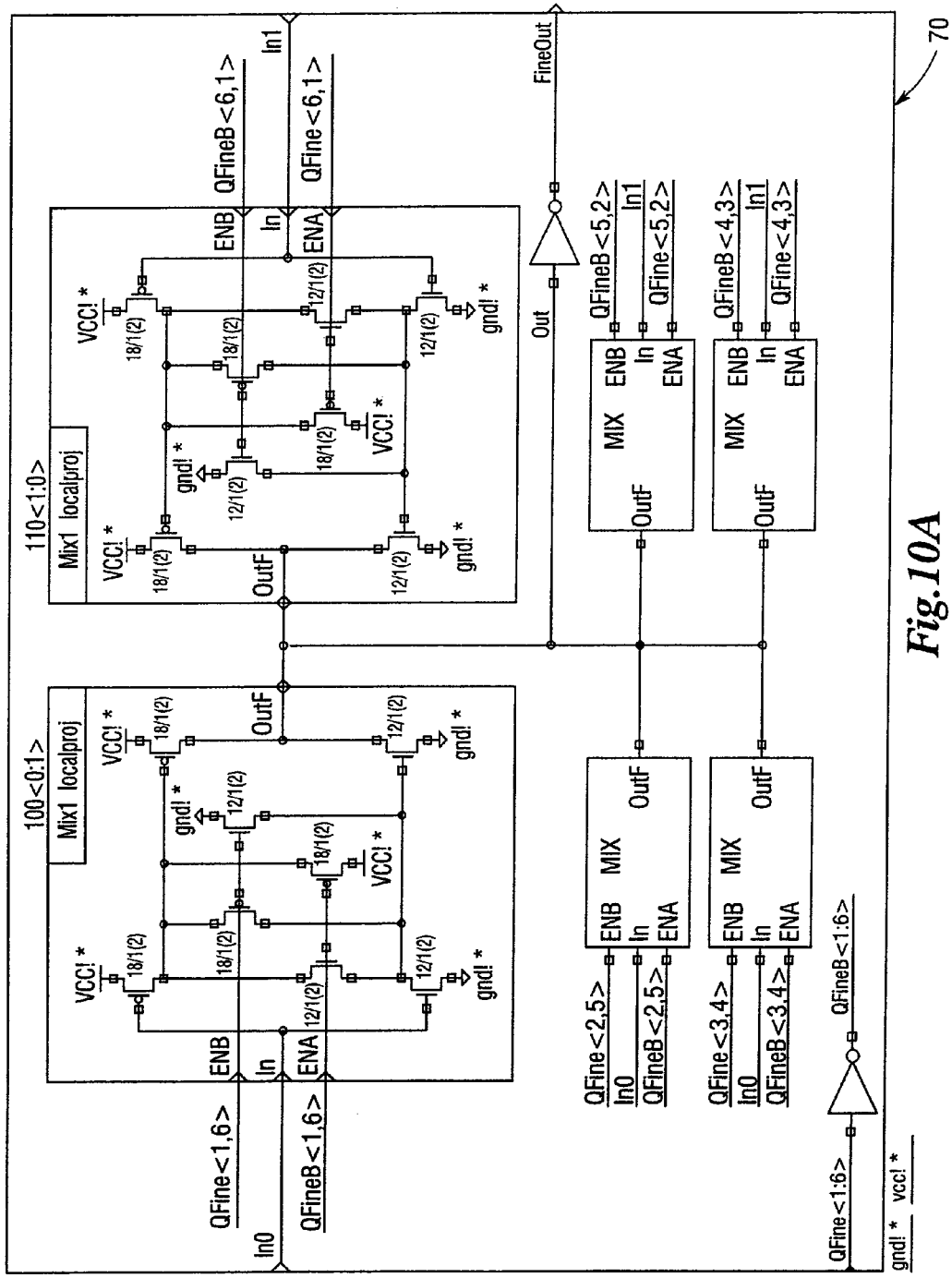
FIG. 10A is an example of an optimized six weight phase mixer having distributed make-before-break drivers.

FIG. 10A is an example of an optimized six weight phase mixer 70 having distributed make-before-break drivers and associated input circuitry constructed according to the teachings of the present disclosure. The phase mixer 70 has been optimized to provide a reduced component count, while operating with a make-before-break control scheme. The phase mixer 70 has less fan-in/out and requires less active area and routing than the phase mixer 50. The phase mixer 70 requires less area for overhead/control circuits and provides a reduction in the dynamic power required than the phase mixer 50. Finally, the phase mixer 70 provides for a lower locking time at low frequencies.

Figure 10B:
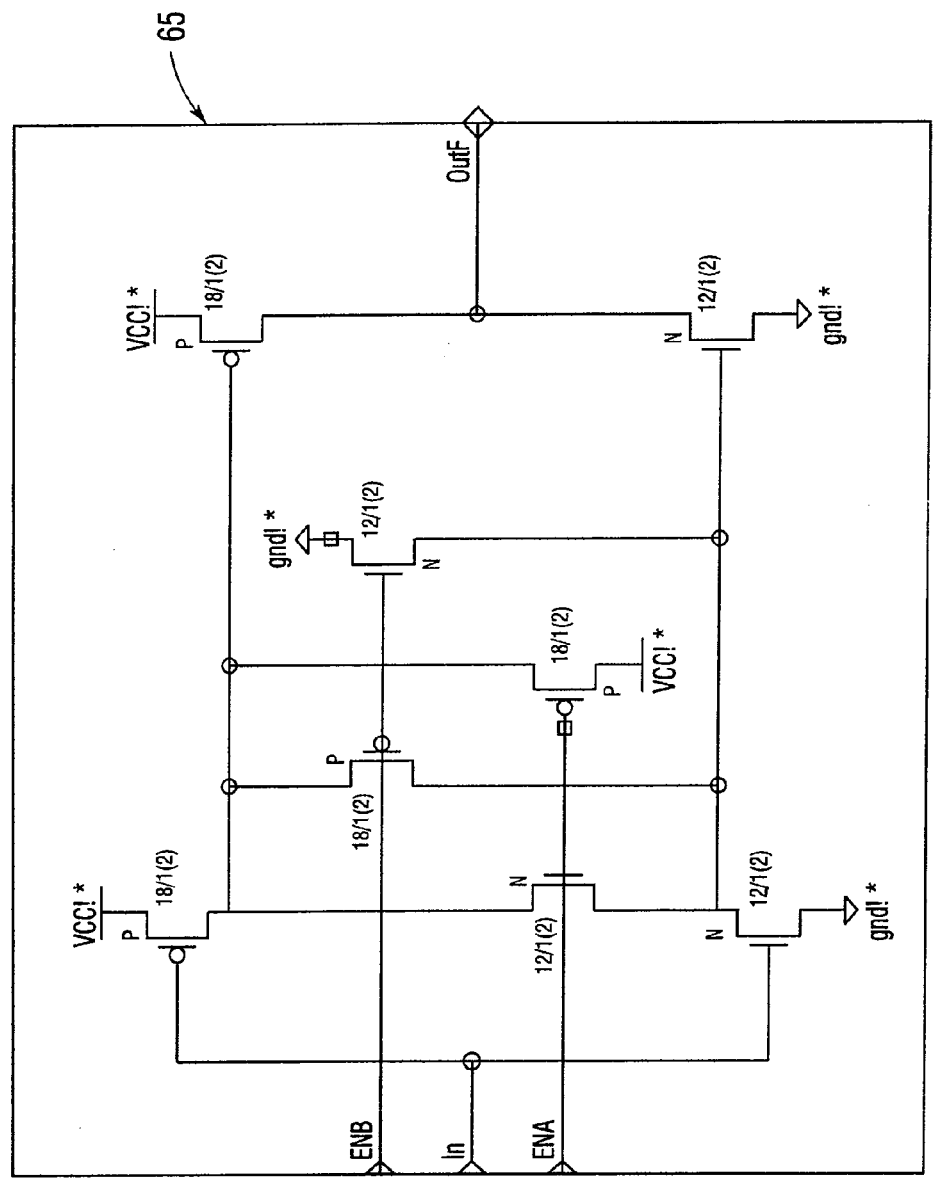
FIG. 10B is a detailed circuit diagram illustrating an example of an optimized unit (one-bit) phase mixer having distributed make-before-break drivers, which may be used in the circuit of FIG. 10A.
Figure 11A:
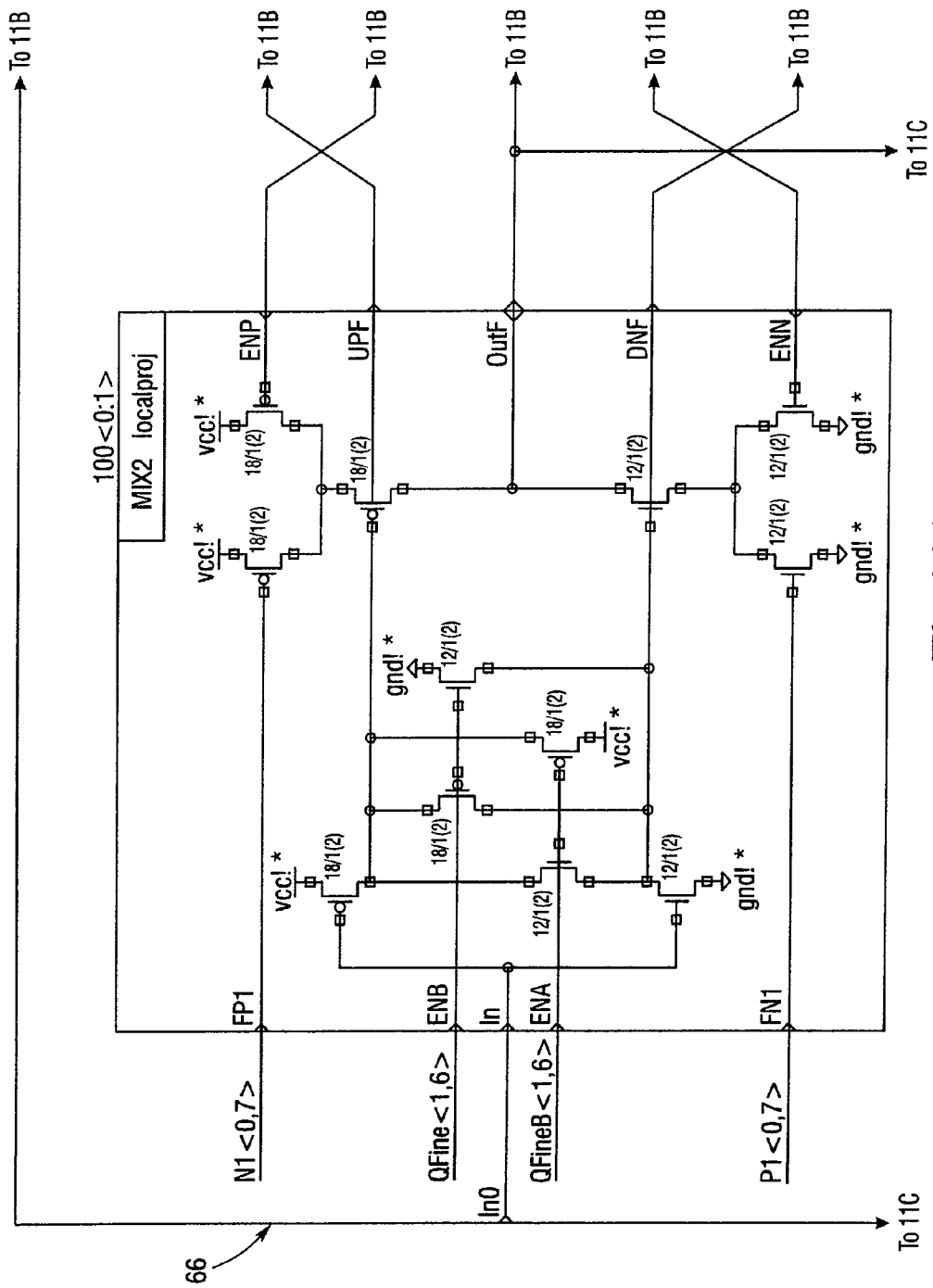
FIGS. 11A-11D, collectively
Figure 11B:
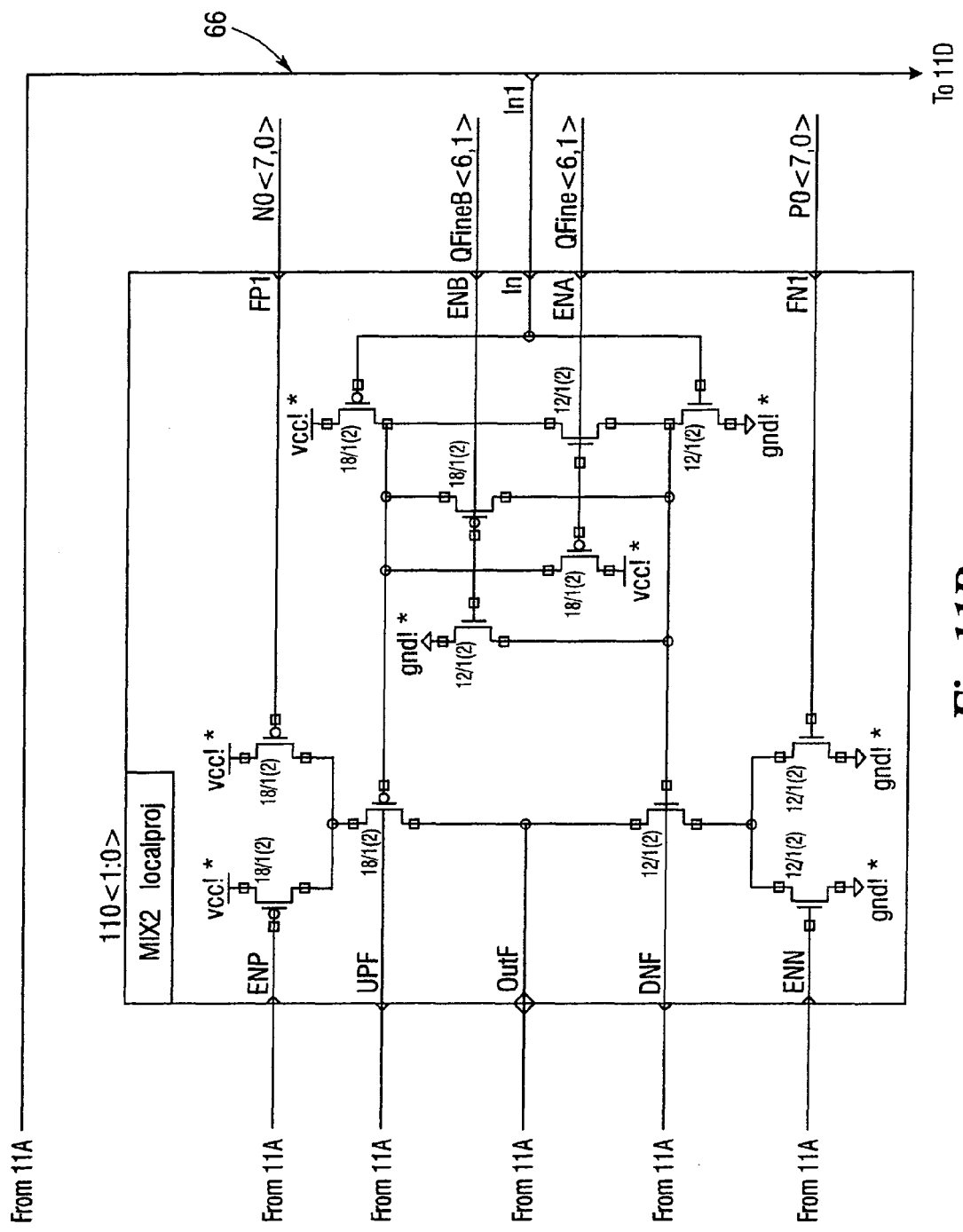
Figure 11C:
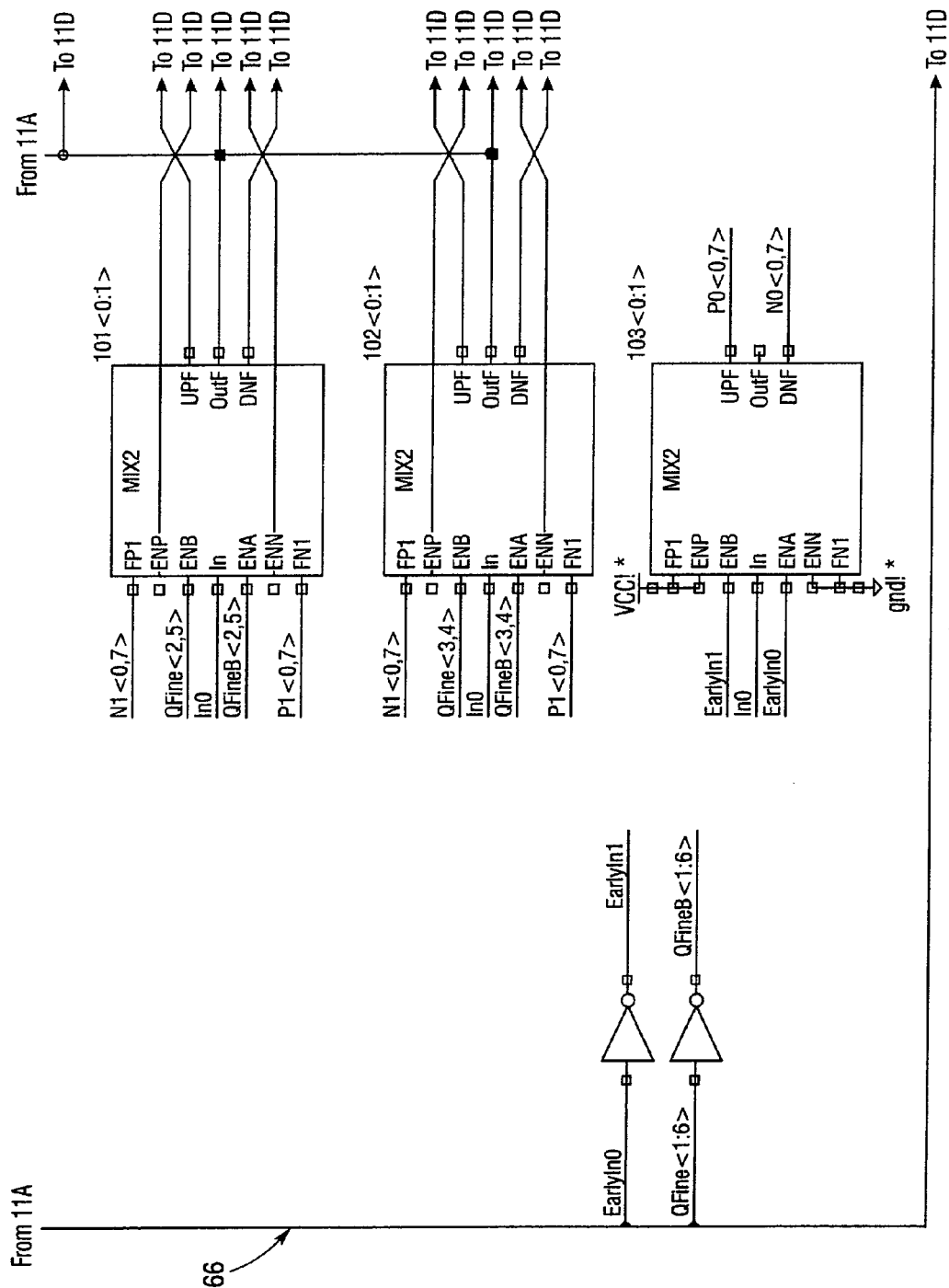
Figure 11D:
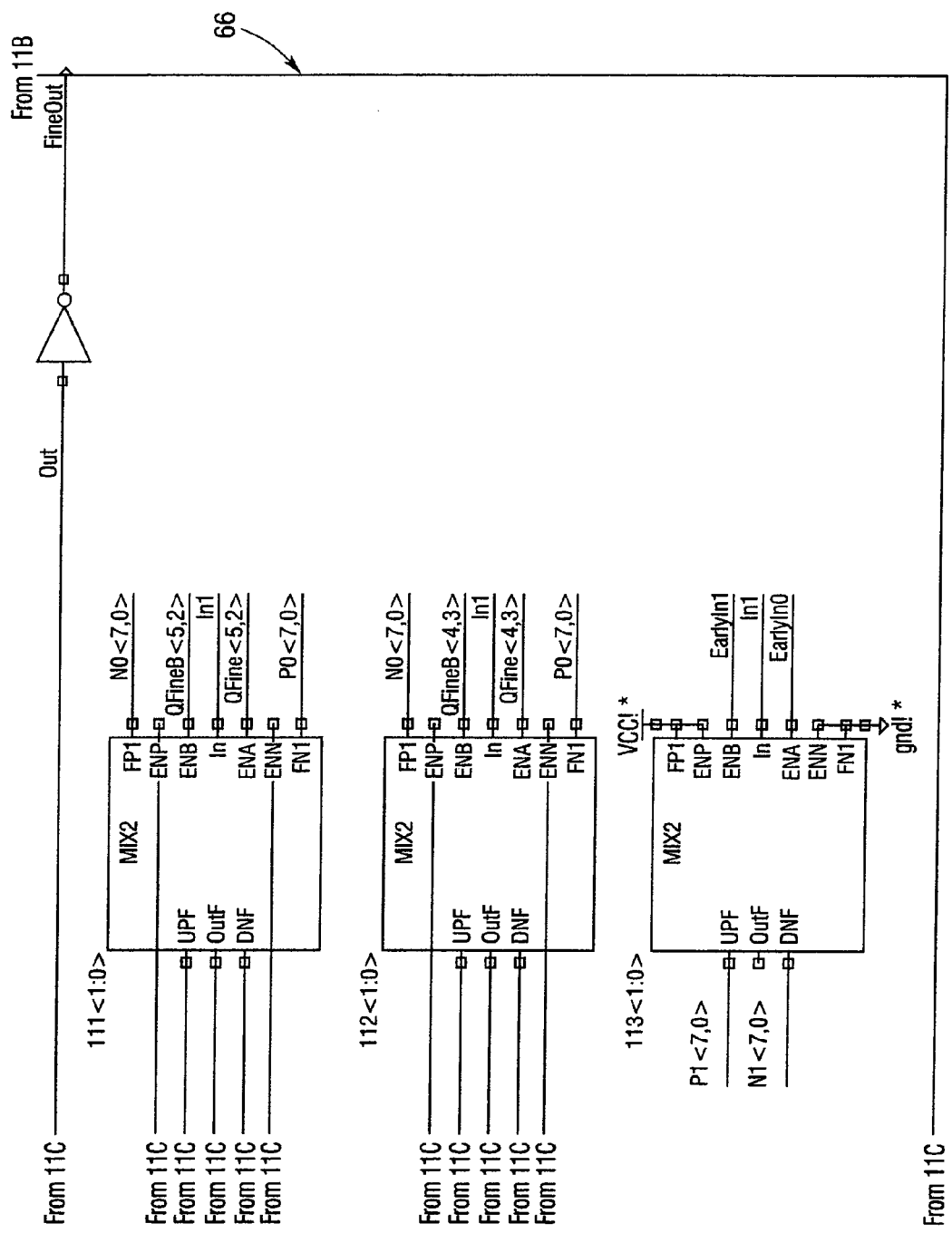

FIG. 10B is a detailed circuit diagram illustrating one example of a reduced component count one-bit phase mixer 65 having distributed break-before-make drivers according to the teachings of the present disclosure and which may be used in the circuit of FIG. 10A. All of the mixers shown in FIG. 10A may be similarly constructed, with the input signals modified to so as to enable the phase mixer 70 to operate as described above. The one-bit phase mixer 65 shown in FIG. 10B is not described in detail as that circuit merely illustrates one exemplary embodiment, the operation of which will be understood by one of ordinary skill in the art upon reviewing the figure.

Compared to the centralized input buffers for skewing the input signals by differing amount shown in FIG. 7, the distributed break-before-make drivers in FIG. 8 or 10A are better for wide frequency range performance.

FIG. 11 is an example of an optimized six-weight phase mixer 66 having distributed break-before-make drivers, feedback loops, and early turn-off constructed according to the teachings of the present disclosure. The phase mixer 66 has been optimized to provide performance similar to the phase mixer 50, while having a reduced component count. The reduced component counts results in phase mixer 66 having less fan-in/out and requiring less active area than phase mixer 50.

Figure 12:
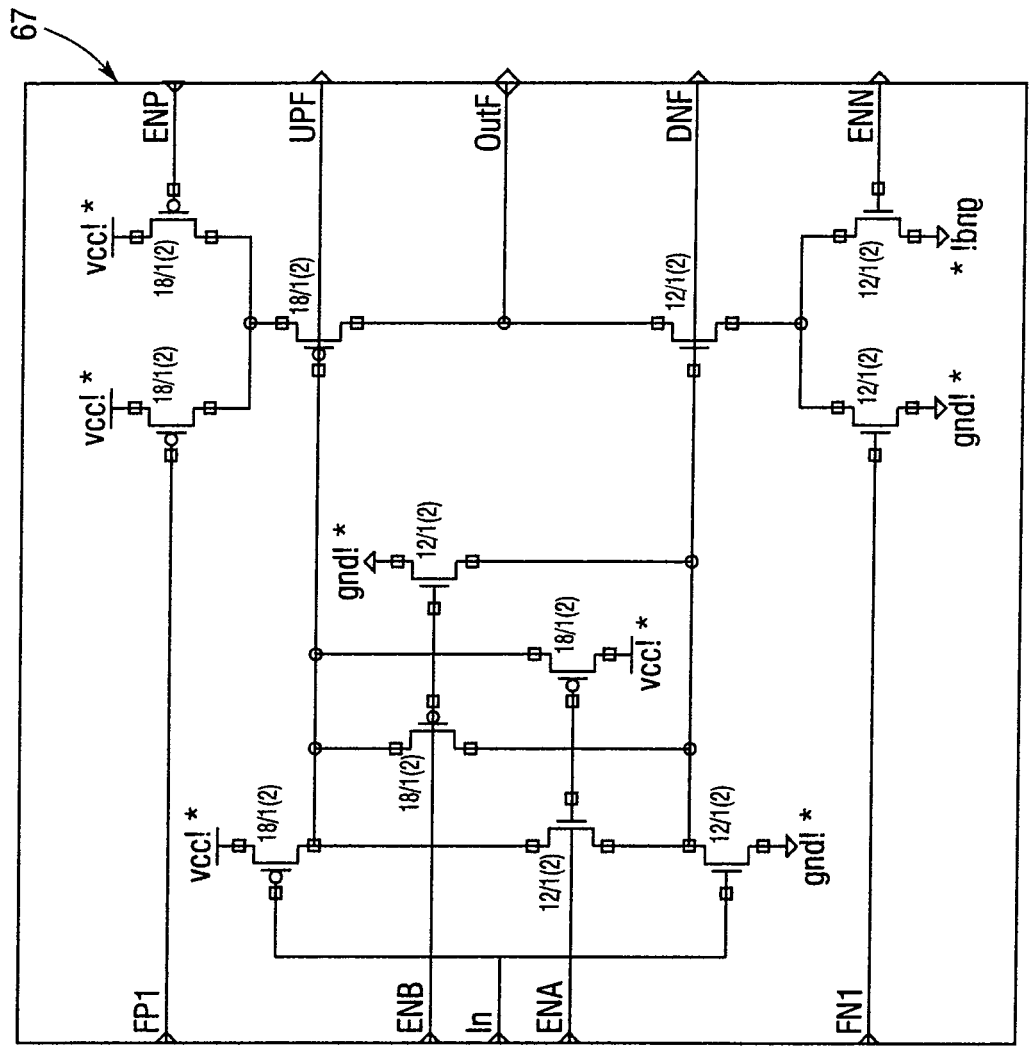
FIG. 12 is a detailed circuit diagram illustrating an example of a unit (one-bit) phase mixer having distributed break-before-make drivers, feedback, and early turn-off, which may be used in the circuit of FIG. 11.

FIG. 12 is a detailed circuit diagram illustrating one example of a reduced component count one-bit phase mixer 67 having distributed break-before-make drivers, feedback loops, and early turn-off according to the teachings of the present disclosure and which may be used in the circuit of FIG. 11. All of the mixers shown in FIG. 11 may be similarly constructed, with the input signals modified to so as to enable the phase mixer 66 to operate as described above. The one-bit phase mixer 67 shown in FIG. 12 is not described in detail as that circuit merely illustrates one exemplary embodiment, the operation of which will be understood by one of ordinary skill in the art upon reviewing the figure.

Figure 13:
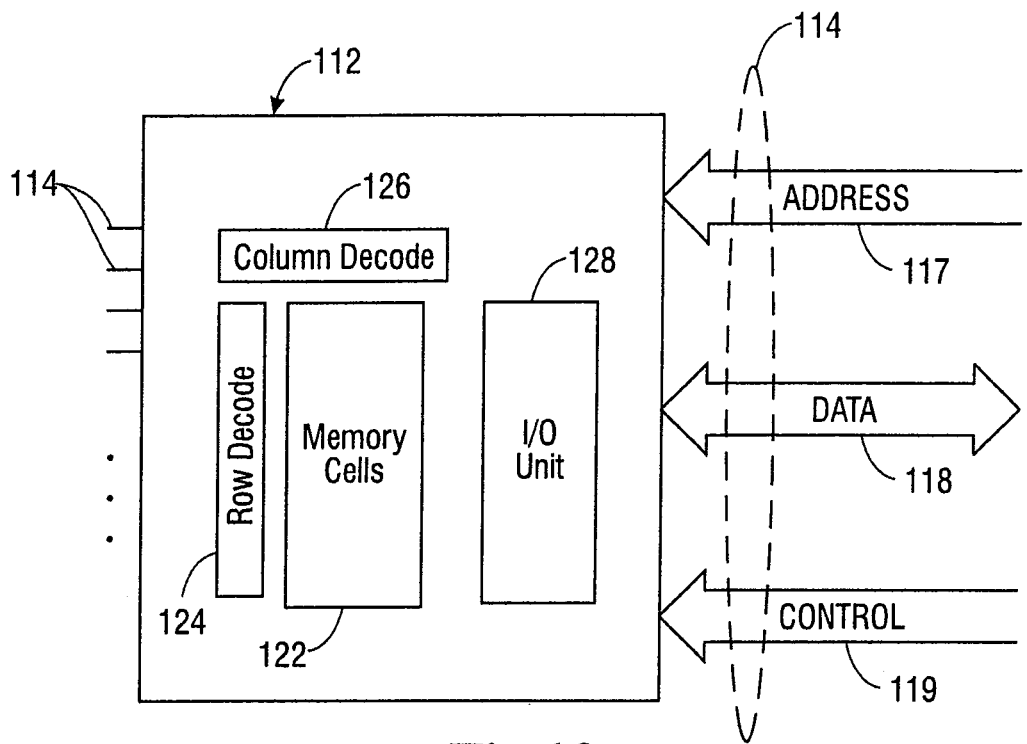
FIG. 13 is a block diagram of a memory device of a type which may have a clock synchronization circuit using a phase mixer of the present disclosure.

FIG. 13 is a simplified block diagram showing a memory chip or memory device 112. The memory chip 112 may be part of a DIMM (dual in-line memory module) or a PCB (printed circuit board) containing many such memory chips (not shown in FIG. 13). The memory chip 112 may include a plurality of pins or ball contacts 114 located outside of chip 112 for electrically connecting the chip 112 to other system devices. Some of those pins 114 may constitute memory address pins or address bus 117, data (DQ) pins or data bus 118, and control pins or control bus 119. It is evident that each of the reference numerals 117-119 designates more than one pin in the corresponding bus. Further, it is understood that the diagram in FIG. 13 is for illustration only. That is, the pin arrangement or configuration in a typical memory chip may not be in the form shown in FIG. 13.

A processor or memory controller (not shown) may communicate with the chip 112 and perform memory read/write operations. The processor and the memory chip 112 may communicate using address signals on the address lines or address bus 117, data signals on the data lines or data bus 118, and control signals (e.g., a row address strobe (RAS) signal, a column address strobe (CAS) signal, a chip select (CS) signal, etc. (not shown)) on the control lines or control bus 119. The "width" (i.e., number of pins) of address, data and control buses may differ from one memory configuration to another.

Those of ordinary skill in the art will readily recognize that memory chip 112 of FIG. 13 is simplified to illustrate one embodiment of a memory chip and is not intended to be a detailed illustration of all of the features of a typical memory chip. Numerous peripheral devices or circuits may be typically provided along with the memory chip 112 for writing data to and reading data from the memory cells 122. However, only certain of these peripheral devices or circuits are shown in FIG. 13 for the sake of clarity.

The memory chip 112 may include a plurality of memory cells 122 generally arranged in an array of rows and columns. A row decode circuit 124 and a column decode circuit 126 may select the rows and columns, respectively, in the array in response to decoding an address provided on the address bus 117. Data to/from the memory cells 122 are then transferred over the data bus 118 via sense amplifiers and a data output path (not shown). A memory controller (not shown) may provide relevant control signals (not shown) on the control bus 119 to control data communication to and from the memory chip 112 via an I/O (input/output) circuit 128. The I/O circuit 128 may include a number of data output buffers or output drivers to receive the data bits from the memory cells 122 and provide those data bits or data signals to the corresponding data lines in the data bus 118. The I/O circuit 128 may also include various memory input buffers and control circuits that interact with the row and column decoders 124, 126, respectively, to select the memory cells for data read/write operations.

The memory controller (not shown) may determine the modes of operation of memory chip 112. Some examples of the input signals or control signals (not shown in FIG. 13) on the control bus 119 include an External Clock (CLK) signal, a Chip Select (CS) signal, a Row Address Strobe (RAS) signal, a Column Address Strobe (CAS) signal, a Write Enable (WE) signal, etc. The memory chip 112 communicates to other devices connected thereto via the pins 114 on the chip 112. These pins, as mentioned before, may be connected to appropriate address, data and control lines to carry out data transfer (i.e., data transmission and reception) operations.

Figure 14:
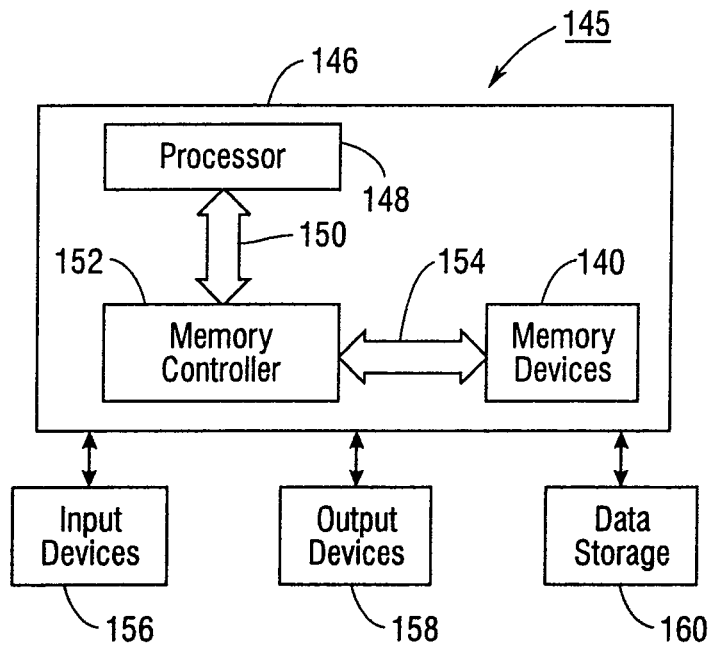
FIG. 14 is a block diagram of system using one or more memory devices of the type illustrated in FIG. 13.

FIG. 14 is a block diagram depicting a system 145 in which one or more memory chips 112 illustrated in FIG. 22 may be used. The system 145 may include a data processing unit or computing unit 146 that includes a processor 148 for performing various computing functions, such as executing specific software to perform specific calculations or data processing tasks. The computing unit 146 also includes a memory controller 152 that is in communication with the processor 148 through a bus 150. The bus 150 may include an address bus (not shown), a data bus (not shown), and a control bus (not shown). The memory controller 152 is also in communication with a set of memory devices 140 (i.e., multiple memory chips 112 of the type shown in FIG. 13) through another bus 154 (which may be similar to the bus 114 shown in FIG. 13). Each memory device 112 may include appropriate data storage and retrieval circuitry as shown in FIG. 13. The processor 148 can perform a plurality of functions based on information and data stored in the memories 140.

The memory controller 152 can be a microprocessor, digital signal processor, embedded processor, micro-controller, dedicated memory test chip, a tester platform, or the like. The memory controller 152 may control routine data transfer operations to/from the memories 140, for example, when the memory devices 140 are part of an operational computing system 145. The memory controller 152 may reside on the same motherboard (not shown) as that carrying the memory chips 140. Various other configurations of electrical connection between the memory chips 140 and the memory controller 152 may be possible. For example, the memory controller 152 may be a remote entity communicating with the memory chips 112 via a data transfer or communications network (e.g., a LAN (local area network) of computing devices).

The system 145 may include one or more input devices 156 (e.g., a keyboard or a mouse) connected to the computing unit 146 to allow a user to manually input data, instructions, etc., to operate the computing unit 146. One or more output devices 158 connected to the computing unit 146 may also be provided as part of the system 145 to display or otherwise output data generated by the processor 148. Examples of output devices 158 include printers, video terminals or video display units (VDUs). In one embodiment, the system 145 also includes one or more data storage devices 160 connected to the data processing unit 146 to allow the processor 148 to store data in or retrieve data from internal or external storage media (not shown). Examples of typical data storage devices 160 include drives that accept hard and floppy disks, CD-ROMs (compact disk read-only memories), and tape cassettes. As noted before, the memory devices 140 in the computing unit 146 have the configuration illustrated in FIG. 13.

It is observed that although the discussion given hereinabove has been primarily with reference to memory devices, it is evident that the phase mixer disclosed herein may be employed, with suitable modifications which may be evident to one skilled in the art, in any other electronic devices.

While the disclosure has been described in detail and with reference to specific embodiments thereof, it will be apparent to one skilled in the art that various changes and modifications can be made therein without departing from the spirit and scope of the embodiments. Thus, it is intended that the present disclosure cover the modifications and variations of this disclosure provided they come within the scope of the appended claims and their equivalents.

What is claimed is:

1. An apparatus, comprising:
   an output terminal;
   a pull-up path coupled to the output terminal and configured to selectively provide a first voltage to the output terminal based, at least in part, on a first clock signal; and
   a pull-down path coupled to the output terminal and configured to selectively provide a second voltage to the output terminal based, at least in part, on a second clock
   wherein the pull-up path is configured to selectively provide the first voltage while the pull-down path is disabled and the pull-down path is configured to selectively provide the second voltage while the pull-up path is disabled.

2. The apparatus of claim 1, wherein the pull-up path further comprises:
a first transistor having a first type, the first transistor configured to receive an enable signal; and
a second transistor having the first type, the second transistor coupled in series with the first transistor and to the output terminal, the second transistor configured to receive the first clock signal.

3. The apparatus of claim 2, wherein the pull-down path further comprises:
a third transistor having, a second type, the third transistor configured to receive a second enable signal; and
a fourth transistor having the second type, the fourth transistor coupled in series with the third transistor and to the output terminal, the fourth transistor configured to receive the second clock signal.

4. The apparatus of claim 3, wherein the enable signal is a logical inverse of the second enable signal.

5. The apparatus of claim 3, wherein the first type is a p-type transistor and the second type is an n-type transistor.

6. The apparatus of claim further comprising:
a first input buffer configured to provide the first clock based on an input clock signal; and
a second input buffer configured to provide the second clock based on the input clock.

7. An apparatus, comprising:
a first pair of input buffers configured to received a first signal and to provide, based on the first signal having a first skew, a first up signal and a first down signal;
a first plurality of phase mixers, wherein each of the first plurality of phase mixers is configured to receive the first up signal and the first down signal, the first plurality of phase mixers configured to provide a first voltage to an output terminal based, at least in part, on the first up signal the first down signal;
a second pair of input buffers configured to receive a second signal and to provide, based on the second signal having a second a skew that is different than the first skew of the first signal, a second up signal and a second down signal to the second plurality of phase mixers; and
a second plurality of phase mixers, wherein each of the second plurality of phase mixers is configured to receive the second up signal and the second down signal, the second plurality of phase mixers configured to provide a second voltage to the output terminal based, at least in part, on the second up signal and the second down signal.

8. The apparatus of claim 7, wherein a size of the first pair of input buffers is the same as a size of the second pair of input buffers.

9. The apparatus of claim 7, wherein a duty cycle of the first up signal is different than a duty cycle of the first down signal.

10. The apparatus of claim 7, wherein the first plurality of phase mixers is configured to receive first enable signal, wherein the first plurality of phase mixers configured to provide the first voltage to the output terminal is further based on the first enable signals, and wherein the second plurality of phase mixers is configured to receive second enable signals, wherein the second plurality of phase mixers configured to provide the second voltage to the output terminal is further based on the second enable signals.

11. The apparatus of claim 7, wherein the second signal is delayed relative to the first signal.

12. A method comprising:
receiving a first clock signal and a first voltage at a pull-up path;
receiving a second clock signal and second clock signal at a pull-down path;
providing the first voltage to an output responsive to the first clock signal while the pull-down path is disabled; and
providing the second voltage to an output responsive to the second clock signal the while the pull-up path is disabled.

13. The method of claim 12, further comprising:
disabling the pull-up path while the pull-down path is enabled; and
disabling the pull-down path while the pull-up path is enabled.

14. The method of claim 12, further comprising:
disabling the pull-down path based on a first enable signal; and
disabling, the pull-down path based on a second enable signal.

15. The method of claim 14, wherein the first enable signal has an opposite logical value from the second enable signal.

16. The method of claim 12, further comprising:
providing the first clock signal having a first duty cycle; and
providing, the second clock signal having a second duty cycle.

17. The method of claim 12, wherein the first duty cycle is different than the second duty cycle.

18. A method comprising:
receiving a first up signal and a first down signal at a first plurality of phase mixers, wherein the first up signal and the first down signal are each based on a first signal;
providing, from a first plurality of phase mixers, a first voltage to an output terminal based on the first up signal and the first down signal; and
receiving a second up signal and a second down signal at a second plurality of phase mixers, wherein the second up signal and the second down signal are each based on a second signal that is skewed relative to the first signal;
providing, from a second plurality of phase mixers, a second voltage to the output terminal based on the second up signal and the second signal.

19. The method of claim 18, further comprising:
enabling a subset of the first plurality phase mixers responsive to first enable signals; and
enabling a subset of the second plurality phase mixers responsive to second enable signals.

20. The method of claim 19, wherein enabling a subset of the first plurality phase mixers responsive to first enable signals comprises:
enabling a pull-up path of each of the subset of the first plurality of phase mixers; and
disabling a pull-down path of each of the subset of the first plurality of phase mixers.

21. The method of claim 18, wherein the first up signal and the second up signal have the same duty cycle and wherein the first down signal and the second down signal have the same duty cycle.

* * * * *